(12) United States Patent
Gonzalez et al.

(10) Patent No.: US 6,784,076 B2
(45) Date of Patent: Aug. 31, 2004

(54) PROCESS FOR MAKING A SILICON-ON-INSULATOR LEDGE BY IMPLANTING IONS FROM SILICON SOURCE

(75) Inventors: Fernando Gonzalez, Boise, ID (US); Chandra Mouli, Boise, ID (US); Lyle Jones, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 81 days.

(21) Appl. No.: 10/118,569

(22) Filed: Apr. 8, 2002

(65) Prior Publication Data

US 2003/0190766 A1 Oct. 9, 2003

(51) Int. Cl.[7] .............................................. H01L 21/76
(52) U.S. Cl. ...................... 438/426; 438/433; 438/445; 438/447
(58) Field of Search ................................ 438/218, 221, 438/239, 294, 296, 426

(56) References Cited

U.S. PATENT DOCUMENTS

| | | | |
|---|---|---|---|
| 4,222,792 A | 9/1980 | Lever et al. .................. 148/1.5 |
| 4,361,600 A | 11/1982 | Brown ......................... 427/93 |
| 4,407,851 A | 10/1983 | Kurosawa et al. ............. 427/39 |
| 4,604,162 A | 8/1986 | Sobczak ...................... 156/657 |
| 4,615,746 A | 10/1986 | Kawakita et al. ............. 148/1.5 |
| 4,689,872 A | 9/1987 | Appels et al. ............... 437/228 |
| 4,735,821 A | 4/1988 | Yamazaki et al. ........... 427/54.1 |
| 4,814,287 A | 3/1989 | Takemoto et al. ............ 437/62 |
| 4,845,048 A | 7/1989 | Tamaki et al. ................ 437/62 |
| 4,974,060 A | 11/1990 | Ogasawara ................ 357/23.6 |
| 5,084,130 A | 1/1992 | Yamazaki et al. .......... 156/643 |
| 5,176,789 A | 1/1993 | Yamazaki et al. .......... 156/643 |
| 5,214,603 A | 5/1993 | Dhong et al. ................ 365/207 |
| 5,331,197 A | 7/1994 | Miywaki et al. ............. 257/530 |
| 5,336,629 A | 8/1994 | Dhong et al. ................. 437/52 |
| 5,453,396 A | 9/1995 | Gonzalez et al. ............. 437/69 |
| 5,629,539 A | 5/1997 | Aoki et al. .................. 257/306 |
| 5,680,556 A | * 10/1997 | Begun et al. ................ 710/315 |
| 5,686,748 A | * 11/1997 | Thakur et al. .............. 257/310 |
| 6,110,798 A | * 8/2000 | Gonzalez et al. ........... 438/426 |
| 6,110,799 A | 8/2000 | Huang ......................... 438/430 |
| 6,300,179 B1 | 10/2001 | McKee ....................... 438/206 |
| 6,330,181 B1 | 12/2001 | McKee ....................... 365/149 |
| 6,423,596 B1 | 7/2002 | McKee ....................... 438/253 |
| 6,465,865 B1 | 10/2002 | Gonzalez .................... 257/506 |
| 6,468,883 B2 | 10/2002 | Dennison ................... 438/475 |
| 6,476,490 B1 | 11/2002 | Dennison ................... 257/758 |
| 6,479,370 B2 | 11/2002 | Gonzalez et al. ........... 438/439 |
| 6,559,032 B2 | 5/2003 | Gonzalez .................... 438/439 |
| 6,569,733 B2 | 5/2003 | McKee ....................... 438/253 |
| 6,569,734 B2 | 5/2003 | McKee ....................... 438/253 |

OTHER PUBLICATIONS

US 6,251,752, 6/2001, Gonzalez et al. (withdrawn)
S. Wolf et al., Silicon Processing for the VLSI Era, vol. 1, Lattice Press, 1986, p. 283.*

* cited by examiner

Primary Examiner—Long Pham
Assistant Examiner—Anh Duy Mai
(74) Attorney, Agent, or Firm—Schwegman, Lundberg, Woessner & Kluth, P.A.

(57) ABSTRACT

A process of making a partial silicon-on-insulator ledge is disclosed. A deep implantation region is created in a substrate. During a lateral cavity etch, the deep implantation region resists etching. The lateral cavity etch acts to partially isolate an active area above the deep implantation region. The deep implantation region is formed at various process stages according to embodiments. An active device is also disclosed that is achieved by the process. A system is also disclosed that uses the active device.

33 Claims, 16 Drawing Sheets

US 6,784,076 B2

PROCESS FOR MAKING A SILICON-ON-INSULATOR LEDGE BY IMPLANTING IONS FROM SILICON SOURCE

FIELD OF THE INVENTION

An embodiment relates to semiconductor processing. One embodiment in particular relates to a process for making a silicon-on-insulator ledge structure that includes a partially isolated active area in a semiconductive substrate.

BACKGROUND

Semiconductor processing is an intensive activity during which several processes are integrated to achieve a working device. Miniaturization is the process of crowding more semiconductive devices onto a smaller substrate area in order to achieve better device speed, lower energy usage, and better device portability, among others. New processing methods must often be developed to enable miniaturization to be realized. Preferably, the processing methods needed to fabricate such devices are developed in a manner that existing processing equipment can be used.

The pressure to continue the miniaturization process also leads to new semiconductor device structures. As individual active devices become smaller and are fabricated closer together, leakage and second order effects become more significant. In the field of metal oxide semiconductor field-effect transistors (MOSFET), device leakage and miniaturization appear to be antagonistic challenges. Often, oxidation is carried out for the purpose of isolation, but oxidation often imparts stresses in the workpieces that lead to device failure. Deposition processes, although necessary, are time-consuming and costly. Further, deposition processes require masking and careful application. Further, deposition processes are preferentially applied when an integrated process can take advantage of a given deposition simultaneously in unrelated areas of a device.

SUMMARY

The above mentioned problems and challenges are overcome by embodiments of this invention. One embodiment is directed to a process of forming a partially isolated structure of sufficient size to permit the fabrication of an active device thereon. The process includes forming an etch-selective region in the semiconductive workpiece that restricts the effects of an isotropic etch. The etch-selective region is created by implantation that causes the semiconductive material to become amorphous.

Protective material, such as a polysilicon layer and a nitride layer, is deposited over a pad oxide layer to protect the pad oxide layer. An active area is defined by patterning a mask. The protective material, the pad oxide layer, and finally the substrate are etched to form a trench around the active area. A protective film that is typically nitride material, is formed upon exposed silicon. The substrate is etched to deepen the trench around what will become the active area to a level below the protective layer. The etch-selective implantation region is either then formed or exposed by the previous etch. An isotropic etch follows that acts to substantially insulate the active area by its undercutting effect. The implantation region is annealed to repair the crystal lattice of the substrate. Thereafter, an alternative oxidation process is done to further isolate the active area from adjacent active areas or other structures. Oxide spacers are formed on the sides of the active area, and the remainder of the trench is filled to form a shallow trench isolation (STI) structure.

An embodiment is also directed to a partially isolated structure of sufficient size to permit the fabrication of an active device thereon. The partially isolated structure is comprised of a portion of the a substrate that has an undercut lateral cavity that is shaped in a manner which defines the active area of the partially isolated structure.

The process and structure of various embodiments enable active devices to be packed into ultra-dense configurations using currently available fabrication equipment. Because the diode junctions of active devices are formed in areas of the substrate that are at least partially isolated from the remainder of the substrate, the diode junctions may be fabricated to be less leaky.

BRIEF DESCRIPTION OF THE DRAWINGS

In order that the manner in which embodiments of the present invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION

Figure 1:
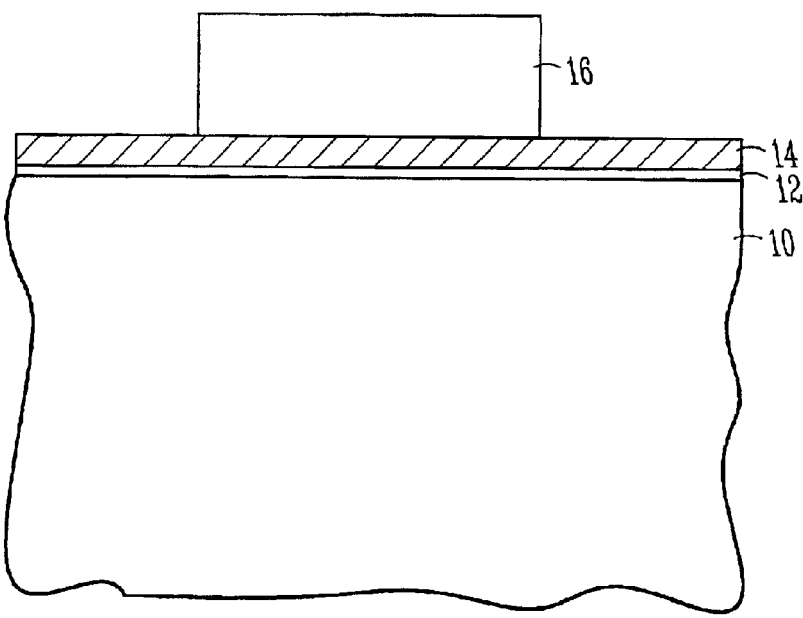
FIG. 1 is a cross section of a structure during processing according to an embodiment.

In one embodiment as depicted in FIG. 1, a substrate 10 is provided which includes a semiconductive material. The terms wafer and substrate used in the following description include any structure having an exposed surface with which to form the integrated circuit (IC) structure relating to embodiments of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The substrate 10 has a pad oxide layer 12 deposited thereon. As used herein, the term deposited is used broadly to mean layers which are not only deposited in the traditional sense, but layers of material which are grown or in any other manner caused to be formed. A protective layer 14 is deposited on top of the pad oxide layer 12 to act as a buffer during subsequent etch steps and other processing. In one embodiment, the protective layer 14 is polysilicon. In one embodiment, the protective layer 14 is a nitride material. In another embodiment, the protective layer 14 is a polysilicon layer that is covered with a nitride material. The specific combination is selected depending upon process integration choices.

A mask 16 is formed and patterned upon the protective layer 14. In one embodiment, the mask 16 is a photoresist material that is spun on, exposed, cured, and patterned. In another embodiment, the mask 16 is a hard mask material such as a nitride or oxide. The area protected by the mask 16 defines what will become an active area in a partial silicon-on-insulator (SOI) structure.

Figure 2:
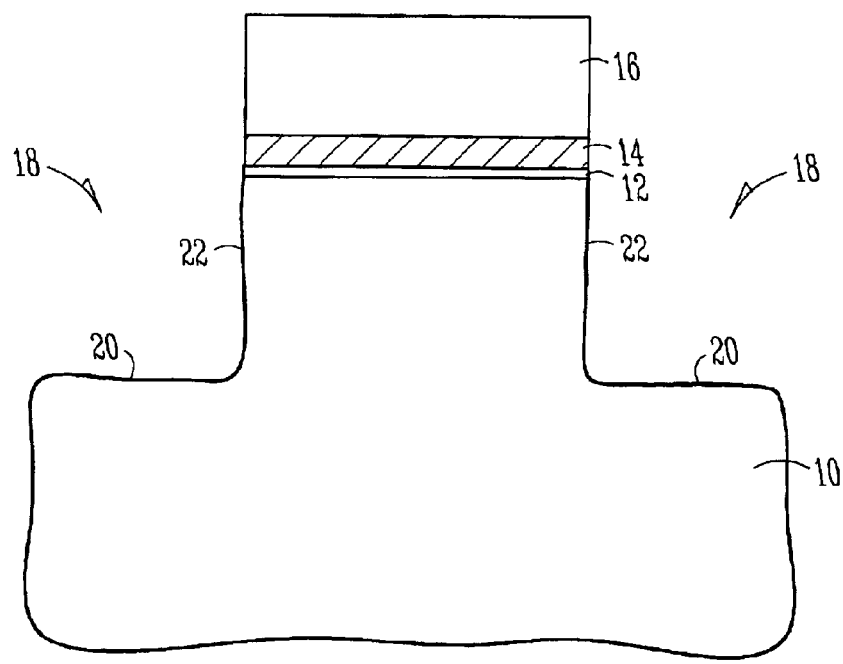
FIG. 2 is a cross section of the structure depicted in FIG. 1 after further processing.

FIG. 2 illustrates an embodiment after an etch process that has exposed the regions unprotected by the mask 16. In the etch process, the protective layer 14 and the pad oxide layer 12 have also been patterned, and a recess 18 has been formed with a recess first bottom 20 and a recess first wall 22.

Figure 3:
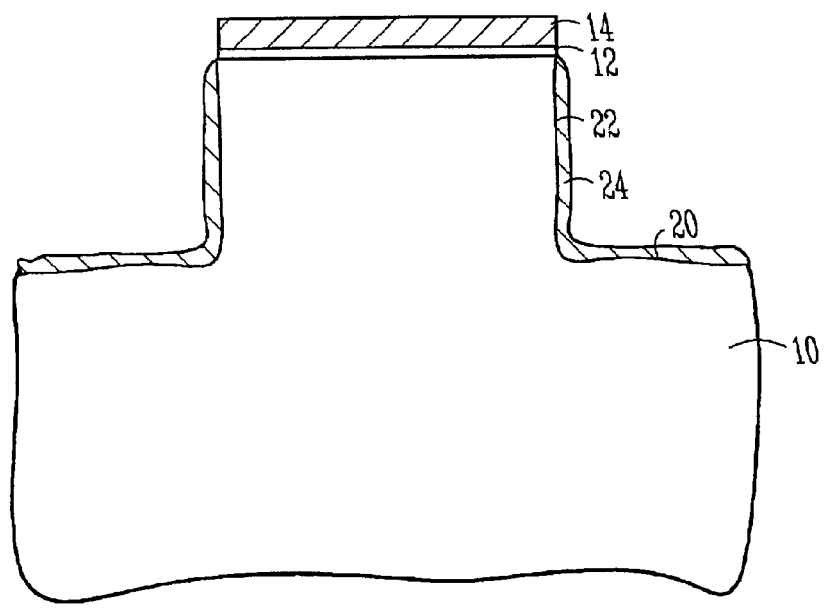
FIG. 3 is a cross section of the structure depicted in FIG. 2 after further processing in which a nitride film has been grown on exposed silicon.

FIG. 3 illustrates the structure depicted in FIG. 2 after further processing in which the mask 16 has been removed and a nitride film 24 has been grown onto the exposed semiconductive material of the substrate 10. In one embodiment, the exposed semiconductive material of the substrate 10 is exposed silicon. The nitride film 24 is depicted as covering the recess first bottom 20 and the recess first wall 22. The nitride film 24 may be grown by known processes under conditions that deposit only upon semiconductive material such as exposed silicon. One such process is remote-plasma nitridation (RPN). In RPN, a nitride-bearing plasma is struck, remote from substrate 10, but within the deposition tool, and the nitride-bearing plasma is carried by convective force toward the substrate 10. In one embodiment, an RPN process is carried out in a time range from about 10 seconds to about 10 minutes. In another embodiment, an RPN process is carried out in a time range from about 1 minute to about 3 minutes. Another process that may be used to form the nitride film 24 is rapid thermal nitridation (RTN). Such processing is also known in the art.

Alternative to the formation of a nitride film 24, an oxide film may be formed, either by remote-plasma oxidation (RPO) or by rapid thermal oxidation (RTO). Similarly, a combination of an oxide and a nitride is formed according to an embodiment as set forth herein. In one embodiment, the placement of the oxide precedes the placement of the nitride, or visa versa. Similarly, an oxynitride film is formed in the place of the nitride film 24 according to an alternative embodiment. The process is carried out by either a remote plasma process or a rapid thermal process. Although not limiting the embodiments disclosed, for convenience throughout the remainder of the disclosure, the film 24 is referred to a the nitride film 24.

Figure 4:
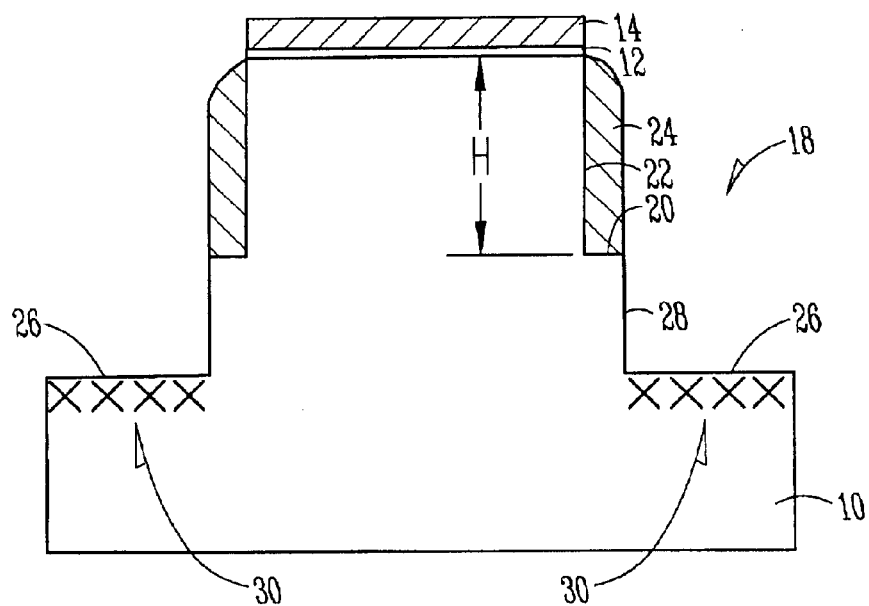
FIG. 4 is a cross section of the structure depicted in FIG. 3 after further processing.

FIG. 4 illustrates processing of the substrate 10 in which an etch has formed a recess second bottom 26 below the level of the recess first bottom 20. The recess first bottom 20 now appears as a substrate ledge structure. Because of the presence of the nitride film 24, the recess first wall 22 is protected, and a recess second wall 28 has been formed that is approximately coplanar with the lateral extremity of the nitride film 24. In one embodiment, an anisotropic etch, such as a reactive ion etch, is used such that the nitride film 24 is left standing upon the ledge of what is left of the recess first bottom 20.

For a 0.25-micron critical-dimension (CD or minimum feature) process, the remnant of the nitride film 24 has a height in a range from about 0.1 microns to about 0.15 microns. In this dimension, the distance from the remnant of the recess first bottom 20 to the recess second bottom 26 is in a range from about 0.1 microns to about 0.3 microns. Alternatively, for a 0.15-micron critical-dimension (CD or minimum feature) process, the remnant of the nitride film 24 has a height, H, in a range from about 0.07 microns to about 0.12 microns. In this dimension, the distance from the remnant of the recess first bottom 20 to the recess second bottom 26 is in a range from about 0.08 microns to about 0.2 microns.

At the level of the recess second bottom 26, a deep implantation region 30 is formed. In one embodiment, the deep implantation region 30 is made of materials that are substantially identical to the bulk semiconductive material in the substrate 10. Implantation is carried out at an energy level that achieves self-interstitial implantation, and that causes the implantation region 30 to become amorphous enough to have an etch responsiveness that is different from the bulk semiconductive material in the substrate 10. In one embodiment, implantation conditions use a silicon source that is implanted to a monocrystalline-to-self interstitial ratio of about 3:1. By "silicon source" it is meant that silicon or another Group IV element is used, or a combination such as silicon and germanium. In one embodiment, the implanted concentration is from about 1E14 atoms/cm$^2$ to about 5E15 atoms/cm$^2$ at process conditions of ambient temperature (20 C. to about 30 C.) and an implantation energy from about 20 KeV to about 30 KeV. In one embodiment, a silicon source that is substantially equivalent to the silicon chemistry of the bulk of the semiconductive substrate 10, is implanted to a concentration of about 1E15 atoms/cm$^2$ and process conditions are about 25 C. and an implantation energy of about 25 KeV.

After the deep implantation, an etch recipe is used in subsequent processing that is selective to the amorphous material of the implantation region 30 and to the nitride film 24, but the etch recipe removes bulk semiconductive material in the substrate 10. In one embodiment, the etch recipe is a wet tetramethyl ammonium hydroxide (TMAH) etch as is known in the art. In another embodiment, the wet etch uses a potassium hydroxide (KOH) etch chemistry that is known in the art. The TMAH etch chemistry is desirable because it is selective such that it etches the bulk silicon of the substrate 10, but does not substantially etch the nitride film 24 or the implantation region 30. In one embodiment, the selectivity is in a range from about 5:1 to about 20:1. In another embodiment, the selectivity is about 10:1. The isotropic etch may also be combined with an anisotropic etch, either before or after the isotropic etch. By using both an isotropic and an anisotropic etch, both the downward etching and the undercutting of the nitride film 24 may be varied to suit particular applications.

Figure 5:
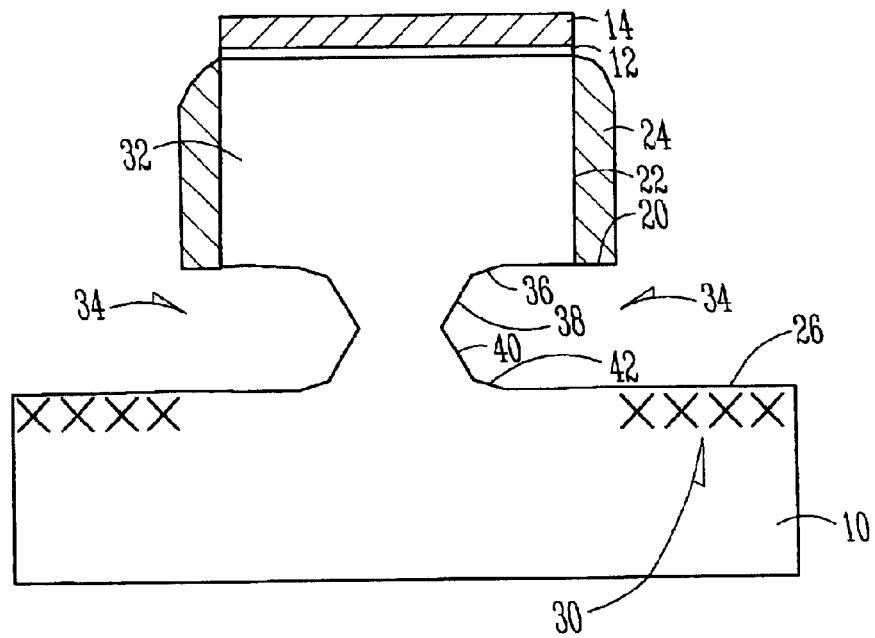
FIG. 5 is a cross section of the structure depicted in FIG. 4 after further processing in which a lateral recess has been etched.

Various wet TMAH etch recipes are known that are selective to amorphous silicon and to nitride films (or oxide films, or oxynitride films), and that isotropically etch bulk monocrystalline silicon along crystallographic planes. FIG. 5 illustrates the results of a TMAH etch that has formed a lateral cavity 34 that has undercut what will become the active area 32. By this undercutting etch, the active area 32 has been mostly isolated from the bulk semiconductive material in the substrate 10, at the level of the ledge that is formed at the recess first bottom 20.

Under the etch conditions, and due to the scale of the lateral cavity 34, a distinctive contour may appear therein. The TMAH etch has an effect along crystallographic planes such that a faceted contour may appear within the lateral cavity 34. It can be seen that faceted surfaces 36, 38, 40, and 42 are illustrated on one side. However, these are depicted in arbitrary shape, angle and size for illustrative purposes, and the specific shapes, angles, and sizes of the faceted surfaces will depend upon the crystallographic orientation of the bulk semiconductive material in the substrate 10 and upon the specific etch recipe and conditions, among other factors. According to the specific etch conditions, a photomicrographic view of the lateral cavity 34 depicts substended crystallographic planes of bulk semiconductive material in the substrate 10 that have been exposed by the TMAH etch.

Figure 6:
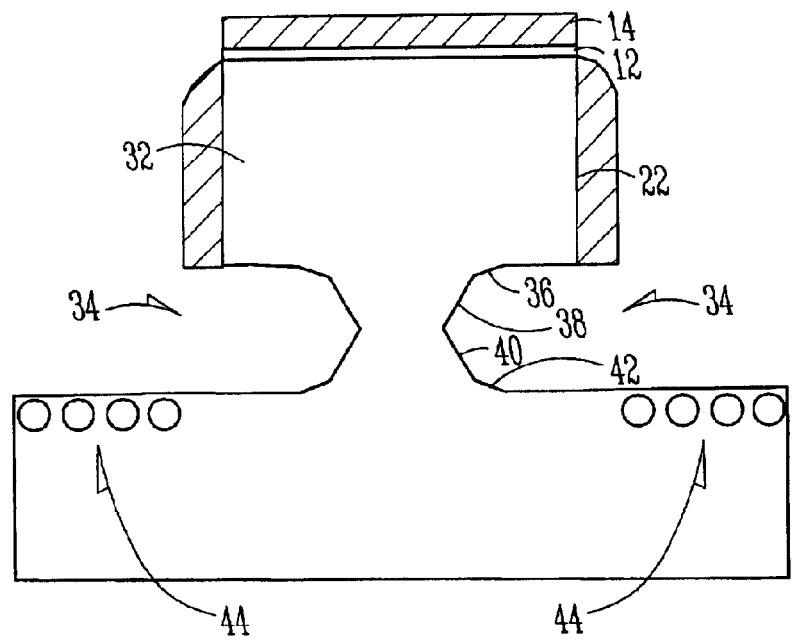
FIG. 6 is a cross section of the structure depicted in FIG. 5 after further processing.

After formation of the lateral cavity 34, the implantation region 30 is treated to form an annealed implantation region 44 as illustrated in FIG. 6. The annealed implantation region 44 has been returned to substantially the same semiconductive quality as the bulk semiconductive material in the substrate 10 by substantially repairing the monocrystalline lattice in what was the deep implantation region 30 (FIG. 5). The conditions for annealing are known in the art, and depend upon the depth of the deep implantation region 30, the available thermal budget of the process, and other factors.

Figure 7:
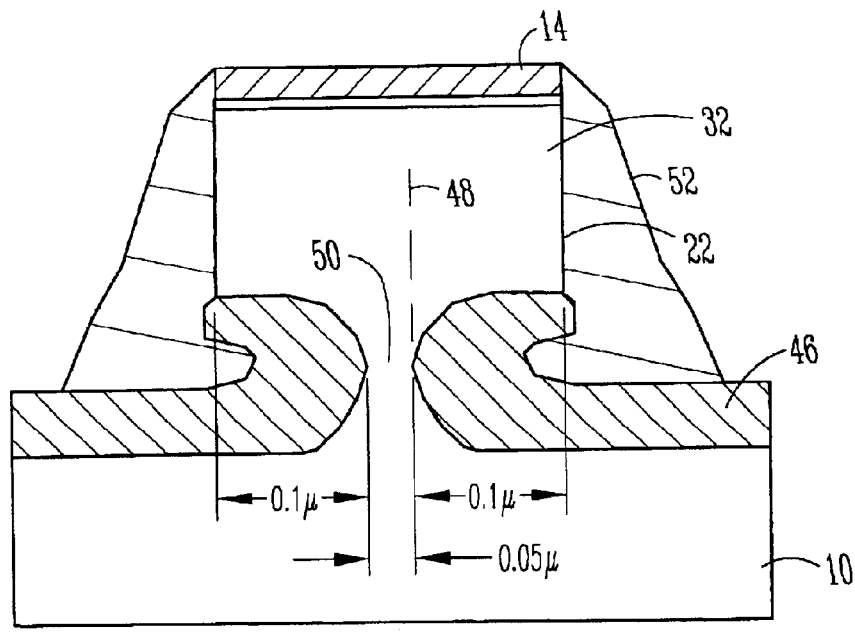
FIG. 7 is a cross section of the structure depicted in FIG. 6 after further processing in which oxidation and oxide fill processes have been done.

FIG. 7 illustrates further processing according to an embodiment. In one embodiment, the exposed surface of the active area 32 and the bulk semiconductive material of the substrate 10 is oxidized. Known thermal oxidation techniques are used. The oxidation 46 consumes silicon downward into the substrate 10, sideways into the faceted surfaces 36, 38, 40, and 42 (FIG. 6), and upward into the bottom of the active area 32. The oxidation 46 is depicted as following the previously exposed contours of the recess second bottom 26 and the faceted surfaces 36, 38, 40, and 42 within the lateral cavity 34, but the exact shape depicted is for illustrative purposes and will vary, depending upon specific process conditions. The oxidation process, which may be referred to as a minifield oxidation, is precisely controlled to regulate the amount of substrate material that is consumed.

According to an embodiment, the residue of the nitride film (FIG. 6) is removed after forming the oxidation 46. Thereby, the original dimension of the recess first wall 22 (FIG. 7) is substantially retained. In one photolithographic process, such as a 0.25-micron process, the dimensions are about 0.1 microns from the recess first wall 22 to the lateral border 48 of the substrate stem 50 that remains. In another photolithographic process, such as a 0.15-micron process, the dimensions are about 0.07 microns (not pictured) from the recess first wall 22 to the lateral border 48 of the silicon stem 50 that remains to this stage of processing.

It is also depicted in FIG. 7, that the protective layer 14 has remained while the nitride film 24 has been removed. This embodiment occurs where the protective layer 14 is chemically different from the nitride film 24, such as a polysilicon protective layer 14. In another embodiment, where the protective layer 14 is a nitride material, it is removed with the nitride film 24 after the minifield oxidation.

As mentioned for a given photolithographic process, the amount of the substrate 10 that is consumed sideways in the lateral cavity 34, for example, is approximately 0.1 micron on each side of the active area 32, beginning at the recess first wall 22 and ending at the lateral border 48 of the stem 50. That oxidation process leaves the stem 50 that partially isolates the substrate portion that will become the active area 32 that is formed above a ledge, at the recess first bottom 20, in relation to the bulk of the substrate 10. In this embodiment, the stem 50 is on the order of 0.05 microns by 0.05 microns. Oxidation time will depend upon the area of the partially isolated structure of the active area 32 and the other parameters. In one embodiment, oxidation parameters include a processing temperature from about 850 C. to about 1,100 C. The ambient is with wet or dry oxygen ($O_2$), and atmospheric pressure or higher. In one example, a temperature of about 850 C. and a wet oxygen ambient is applied at about 1 atmosphere and for a sufficient time to allow about 0.1 micron horizontal oxidation under the active area 32, and about 0.1 micron vertical oxidation upwardly into the active area 32. High pressure may be used to reduce the time required for oxidation and to reduce the amount of oxide that forms behind the nitride film 24 (FIG. 5). High pressure includes atmospheric pressure, up to about 2 atmospheres and higher. After the thermal oxidation process, an oxide spacer 52 is formed by a blanket oxide deposition, such as by the decomposition of tetraethyl ortho silicate (TEOS), followed by a spacer etch as illustrated in FIG. 7.

Figure 8:
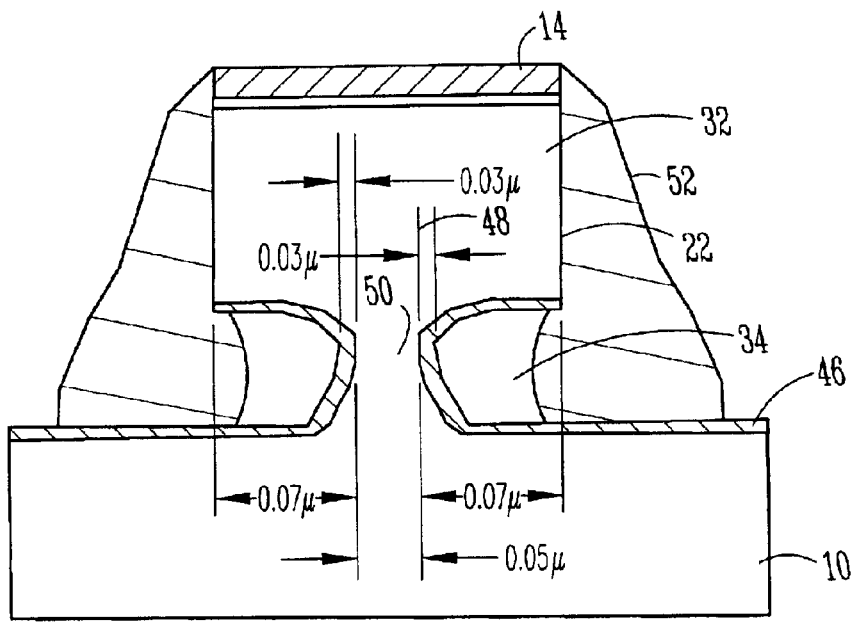
FIG. 8 is a cross section of the structure depicted in FIG. 6 after alternative further processing in which minimal oxidation or no oxidation, and oxide fill processes have been done.

FIG. 8 illustrates another embodiment, wherein the oxidation process is carried out under minimal conditions. The minimal oxidation relates to a lowered workpiece stress in the lateral cavity 34. An oxidation 46 is formed that leaves the lateral cavity 34 mostly void. The oxidation 46 consumes silicon downward into the substrate 10, sideways into the faceted surfaces 36, 38, 40, and 42 (FIG. 6), and upward into bottom of the active area 32. In one photolithographic process, such as a 0.25-micron process, the dimensions are about 0.03 microns growth of oxidation 46 within the lateral cavity 34 to the lateral border 48 of the substrate stem 50 that remains. In another photolithographic process, such as a 0.15-micron process, the dimensions are about 0.01 microns (not pictured) within the lateral cavity 34 to the lateral border 48 of the silicon stem 50 that remains to this stage of processing.

It is also depicted in FIG. 8, that the protective layer 14 has remained while the nitride film 24 has been removed. This embodiment occurs where the protective layer 14 is chemically different from the nitride film 24, such as a polysilicon protective layer 14. In another embodiment, where the protective layer 14 is a nitride material, it is removed with the nitride film.

As mentioned for one photolithographic process, the amount of the substrate 10 that is consumed sideways by the isotropic etch, for example, is approximately 0.07 micron on each side of the active area 32. That oxidation process leaves the stem 50 that connects the substrate that will become the active area 32 to the bulk of the substrate 10. In this embodiment, the stem 50 is on the order of about 0.05 microns by 0.05 microns. Oxidation time will depend upon the area of the partially isolated structure that forms the active area 32 and the other parameters. In one embodiment, oxidation parameters include a processing temperature from about 850 C. to about 1,100 C. The ambient is with wet or dry oxygen ($O_2$), atmospheric pressure or higher. In one example, a temperature of about 850 C. and a wet oxygen ambient is applied for a sufficient time to allow about 0.03 micron horizontal oxidation under the active area 32, and about 0.01 micron vertical oxidation upwardly into the active area 32. High pressure may be used to reduce the time required for oxidation and to reduce the amount of oxide that forms behind the nitride film 24 (FIG. 5). High pressure is defined as a pressure above ambient including a range from about 1 atmosphere to about 2 atmospheres, and higher. After the thermal oxidation process, an oxide spacer 52 is formed by a blanket oxide deposition, such as by the decomposition of TEOS, followed by a spacer etch as illustrated in FIG. 8. According to this embodiment, the oxide spacer 52 is formed under low-pressure chemical vapor deposition (CVD) conditions that cause the lateral cavity 34 to remain partially void. Although no particular theory of deposition is required, it is the low pressure that may cause longer mean-free paths of depositing oxide spacer material that leaves a partially void lateral cavity 34.

In another embodiment illustrated in FIG. 8, an oxide spacer 52 is blanket deposited by physical vapor deposition (PVD) under conditions that also cause the lateral cavity 34 to remain partially or totally void, followed by a spacer etch. In this embodiment, substantially no minifield oxidation is carried out before the blanket deposition and spacer etch of the oxide spacer 52. Thereby, the lateral cavity 34 retains its faceted surfaces 36, 38, 40, and 42 (depicted in FIG. 6). However, unless the isotropic etch is followed by a micro- atmospheric- or oxygen-excluding process, a thin native oxide film 46, represented herein by the oxidation 46 in FIG. 8, will be present over the faceted surfaces 36, 38, 40, and 42 (depicted in FIG. 6). This native oxide film 46 in some embodiments is substantially monatomic, or a few atomic layers thick in a range from about 2 Angstrom to about 8 Angstrom.

Figure 9:
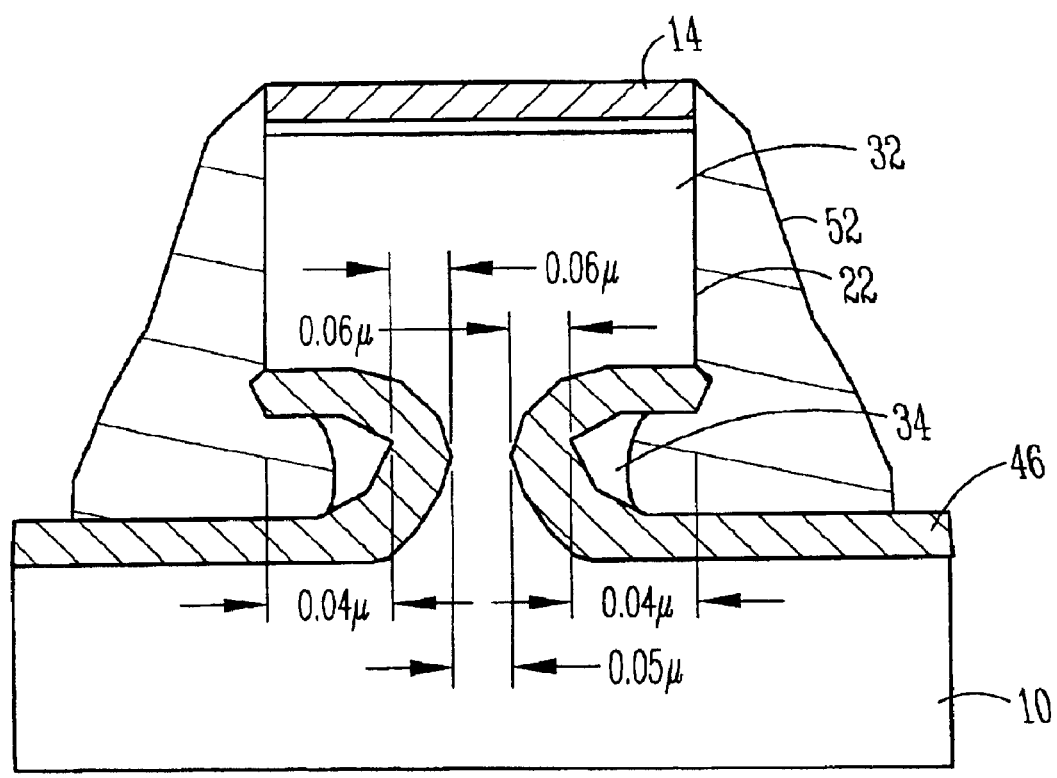
FIG. 9 is a cross section of the structure depicted in FIG. 6 after alternative further processing in which minimal oxidation or no oxidation, and oxide fill processes have been done.

FIG. 9 illustrates an embodiment that relates to an oxidation that has a thickness intermediate to the previous two embodiments. In this embodiment, a process is carried out that partially fills the lateral cavity 34 with oxide material. The extent of fill into the lateral cavity 34 of the oxidation 46 is more than the extent of fill for the embodiment depicted in FIG. 8, and less than the extent of fill for the embodiment depicted in FIG. 7. Dimensions achieved by this embodiment are intermediate to the dimensions that are achieved in the embodiment depicted in FIGS. 8 and 7. In one embodiment, the amount of the substrate 10 that is consumed sideways, for example, is approximately 0.06 micron on each side of the stem 50. That oxidation process leaves the stem 50 that connects the substrate that will become the active area 32 to the bulk of the substrate 10. In this embodiment, the stem 50 is on the order of 0.05 microns by 0.05 microns.

The thickness of the stem 50 is set forth herein as about 0.05 micron for each given embodiment depicted in FIGS. 7, 8 and 9. This thickness is controllable by the extent of the lateral etch that forms the lateral cavity 34, in concert with the degree of growth of the oxidation 46. It can be appreciated that other thicknesses of the stem 50 can be achieved, by controlling these parameters. Table 1 illustrates various geometries based upon lateral etches for a 0.25 micron lithography. The first three embodiments are depicted in FIGS. 7, 9, and 8, respectively. The fourth embodiment is an example of a native oxide oxidation 46, wherein after fabrication, the facets 36, 38, 40, and 42 (FIG. 6) are visible by photomicrography.

TABLE 1

0.25 Micron Process Geometries

| Example | Void Depth, micron | Oxide 46, micron | Stem 50, micron |
|---|---|---|---|
| 1 | 0 | 0.1 | .05 |
| 2 | .03 | .07 | .05 |
| 3 | .07 | .03 | .05 |
| 4 | .0995 | .0005 | .05 |
| 5 | .035 | .06 | .06 |
| 6 | .065 | .03 | .06 |
| 7 | .0945 | .0005 | .06 |
| 8 | 0 | .09 | .07 |
| 9 | .03 | .06 | .07 |
| 10 | .06 | .03 | .07 |
| 11 | .0895 | .0005 | .07 |

Table 2 illustrates various geometries based upon varied lateral etches for a 0.15 micron geometry.

TABLE 2

0.15 Micron Process Geometries

| Example | Void Depth, micron | Oxide 46, micron | Stem 50, micron |
|---|---|---|---|
| 1 | 0 | 0.06 | .03 |
| 2 | .02 | .04 | .03 |
| 3 | .04 | .02 | .03 |
| 4 | .0595 | .0005 | .03 |
| 5 | 0 | .055 | .04 |

TABLE 2-continued 0.15 Micron Process Geometries

| Example | Void Depth, micron | Oxide 46, micron | Stem 50, micron |
|---------|-------------------|------------------|-----------------|
| 6  | .015  | .04   | .04 |
| 7  | .025  | .03   | .04 |
| 8  | 0     | .05   | .05 |
| 9  | .02   | .03   | .05 |
| 10 | .03   | .02   | .05 |
| 11 | .0495 | .0005 | .05 |

Figure 10:
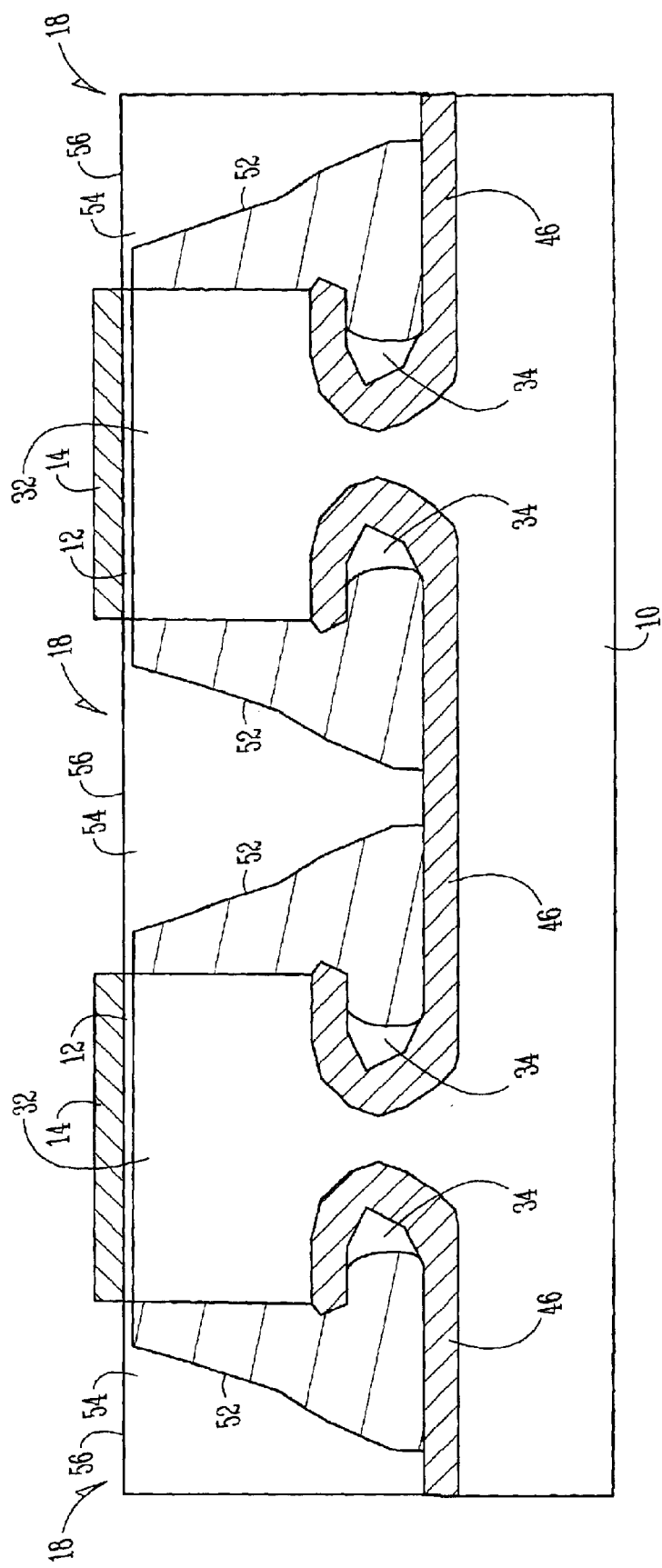
FIG. 10 is a cross section that includes the structure depicted in FIG. 9 after further processing.
Figure 11:
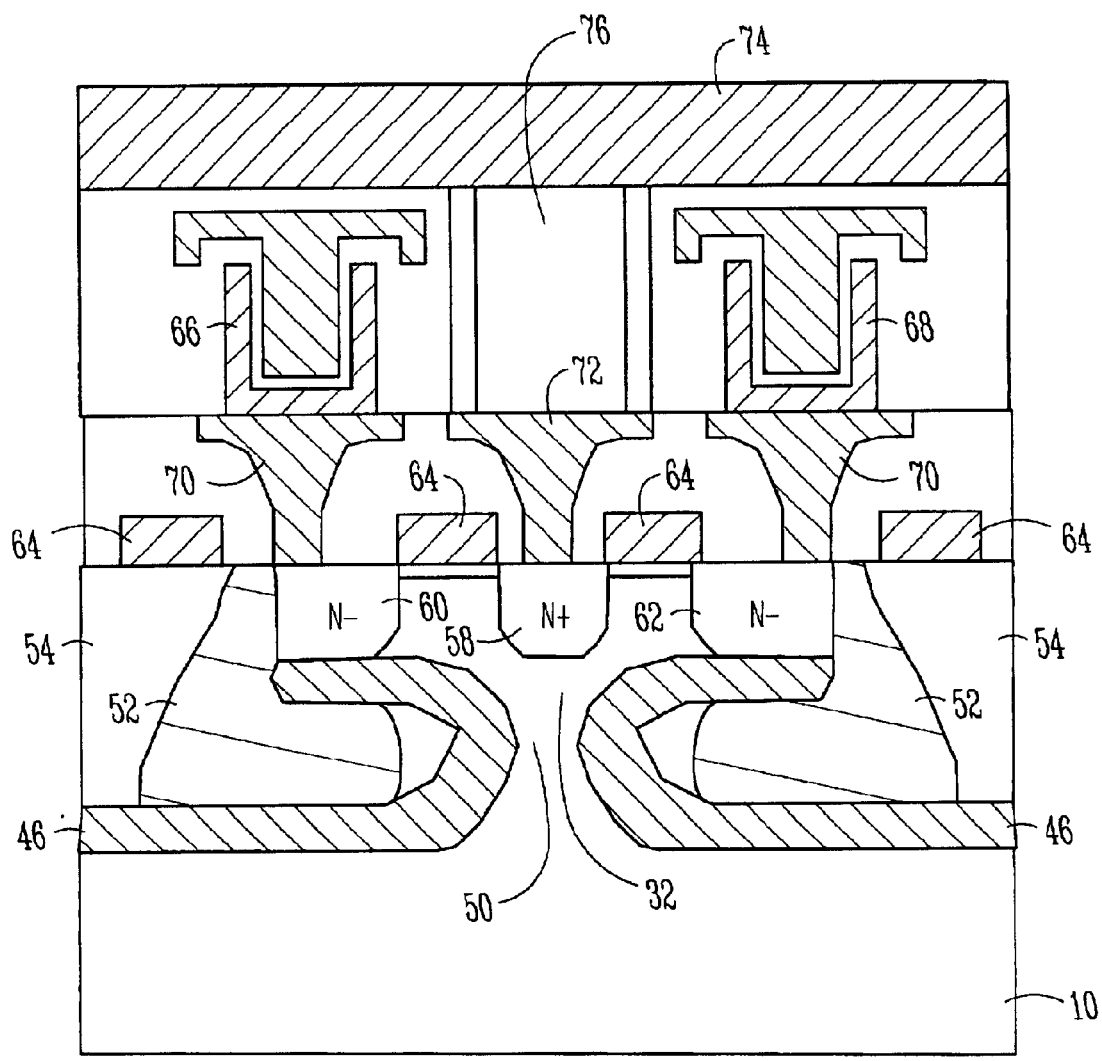
FIG. 11 is a cross section that includes a portion of the structure depicted in FIG. 10 after further processing.

FIGS. 10 and 11 illustrate further processing according to an embodiment taken from the structure depicted in FIG. 9 by way of non-limiting example. FIG. 10 depicts structures constructed with the undercut that formed the lateral cavity 34. In FIG. 10, a larger portion of the substrate 10 is illustrated so that adjacent partially isolated structures of active areas 32 may be seen. The partially isolated active areas 32 are separated by the recess 18 that, in this embodiment, acts as a shallow trench isolation (STI) trench. According to an embodiment, the recess 18 is filled with a material such as oxide by a known process such as a high-density plasma (HDP) technique. In one embodiment, the substrate 10 is blanket HDP deposited with an oxide fill 54 deposition which blankets the substrate 10 and which fills the recess 18. Thereafter, the oxide fill 54 is etched back by a process that stops on the protective layer 14 if it is present as a polysilicon material. Where the protective layer 14 is present as a polysilicon material, overetching of the oxide fill 54 may occur. The etching back process is carried out according to process needs, such as by chemical-mechanical polishing (CMP), mechanical polishing (MP), chemical etchback, and others.

Another embodiment occurs where no protective layer 14 has remained during processing to this extent of the process. For example, where the protective layer 14 is a nitride material, it is removed simultaneously with the remnant of the nitride film 24 (FIG. 6). According to this embodiment, an oxide fill 54 is a doped or undoped material that shows a distinctive etch responsiveness in comparison to the pad oxide layer 12, such that the pad oxide layer 12 acts as the etch stop.

As depicted in FIG. 10, the material filling the recess 18 is etched or planarized so that the top surface 56 of the oxide fill 54 is approximately even with the top surface of the pad oxide layer 12. Where the protective layer 14 is present such as a polysilicon material, the remnants of the protective layer 14 is stripped in a manner so as not to damage the remnants of the pad oxide layer 12. In one embodiment, the remnant of the pad oxide layer 12 is used as a gate oxide for the fabrication of active devices above the active area 32.

Total isolation between devices on the active areas 32 can be as much as 0.65 microns (0.2 microns of the oxide fill 54, plus 0.25 microns of the active are 32, plus 0.2 microns of the oxide fill 54) for a given 0.25-micron lithography. Furthermore, the field oxide regions are comprised of both thermal oxide and deposited oxide so that the advantages of each type of oxide can be gained.

The structure depicted in FIG. 10 is also depicted in FIG. 11 as a storage device, wherein two dynamic random access (DRAM) memory cells are formed thereon. Active devices in the form of a digit line junction 58 and storage node junctions 60 and 62 are formed in the partially isolated active area 32. A word line 64 overlays the active area 32. The storage node junctions 60 and 62 are in electrical contact with respective capacitors 66 and 68 through polysilicon plugs 70. The digit line junction 58 is in electrical contact with a polysilicon plug 72. The polysilicon plug 72 is a contact that touches the active area 32. The polysilicon plug 72 is in further contact with a digit line 74 through a metal plug 76.

A substrate 10 carrying a partially isolated active area 32 provides a vehicle for the fabrication of a storage device such as a DRAM cell, or virtually any type of logic circuit that employs a MOSFET.

While the structure depicted in FIG. 11 illustrates one type of device which might be fabricated upon the workpiece of the substrate 10 and with the use of the partially isolated active area 32, those of ordinary skill in the art will recognize the advantages of fabricating other types of devices according to various embodiments and their equivalents. In particular, active devices formed in the partially isolated active area 32 will be substantially isolated from the bulk of the substrate 10.

Figure 12:
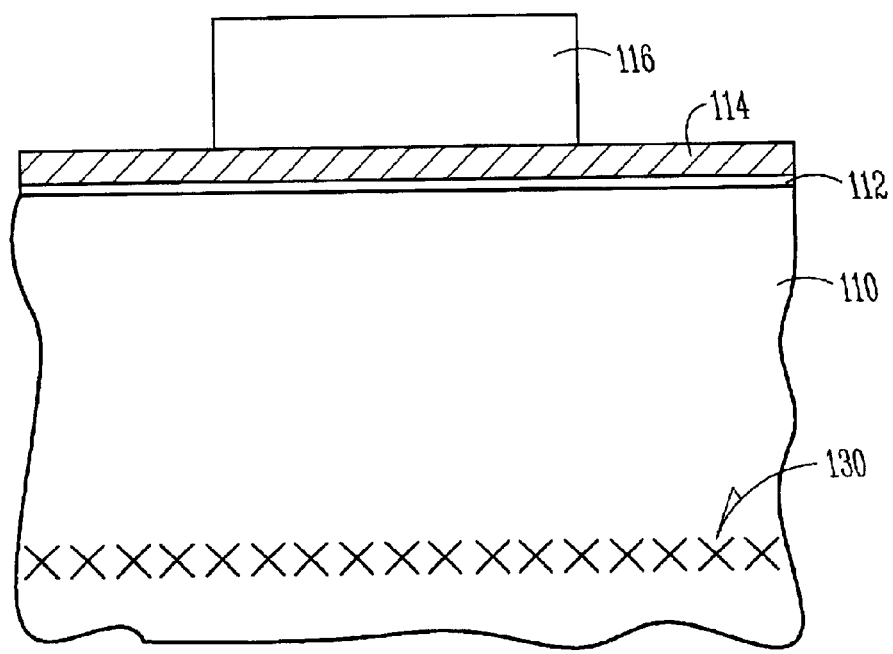
FIG. 12 is a cross section of a structure during processing according to an embodiment.

FIG. 12 illustrates another process embodiment in which a deep implantation region is first implanted into the substrate. In this embodiment, the substrate 110 has a deep implantation region 130 that has been blanket implanted to a depth that is qualitatively equivalent to the location of the deep implantation region 30 depicted in FIG. 4. In one embodiment, the deep implantation region 130 is made of materials that are identical to the bulk semiconductive material in the substrate 110. At the level of the recess second bottom 26, a deep implantation region 30 is formed. In one embodiment, the deep implantation region 30 is made of materials that are substantially identical to the bulk semiconductive material in the substrate 10. Implantation is carried out at an energy level that achieves self-interstitial implantation, and that causes the implantation region 30 to become amorphous enough to have an etch responsiveness that is different from the bulk semiconductive material in the substrate 10. In one embodiment, implantation conditions use a silicon source that is implanted to a monocrystalline-to-self interstitial ratio of about 3:1. By "silicon source" it is meant that silicon or another Group IV element is used, or a combination such as silicon and germanium. In one embodiment, the implanted concentration is from about 5E14 atoms/$cm^2$ to about 5E15 atoms/$cm^2$ at process conditions of ambient temperature (20 C. to about 30 C.) and an implantation energy from about 20 KeV to about 30 KeV. In one embodiment, a silicon source that is substantially equivalent to the silicon chemistry of the bulk of the semiconductive substrate 10, is implanted to a concentration of about 25E14 atoms/$cm^2$ and process conditions are about 25 C. and an implantation energy of about 25 KeV. The vertical implantation profile is controlled to be narrow with respect to the specific process geometry. In one embodiment, the vertical implantation profile has a height of about 0.05 microns when measured upwardly, beginning at the level that will make up the recess second bottom 126 (see FIG. 15).

A pad oxide layer 112 is also deposited on the substrate 110, as well as a protective layer 114 on top of the pad oxide layer 112 to act as a buffer during subsequent etch steps and other processing. In one embodiment, the protective layer 114 is polysilicon. In one embodiment, the protective layer 114 is a nitride material. In another embodiment, the protective layer 114 is a polysilicon layer that is covered with a nitride material. The specific combination is selected depending upon process integration choices.

A mask 116 is formed and patterned upon the protective layer 114. In one embodiment, the mask 116 is a photoresist material or a hard mask material such as a nitride or oxide according to embodiments set forth herein. The area protected by the mask 116 defines what will become a partially isolated active area in a partial SOI structure.

Figure 13:
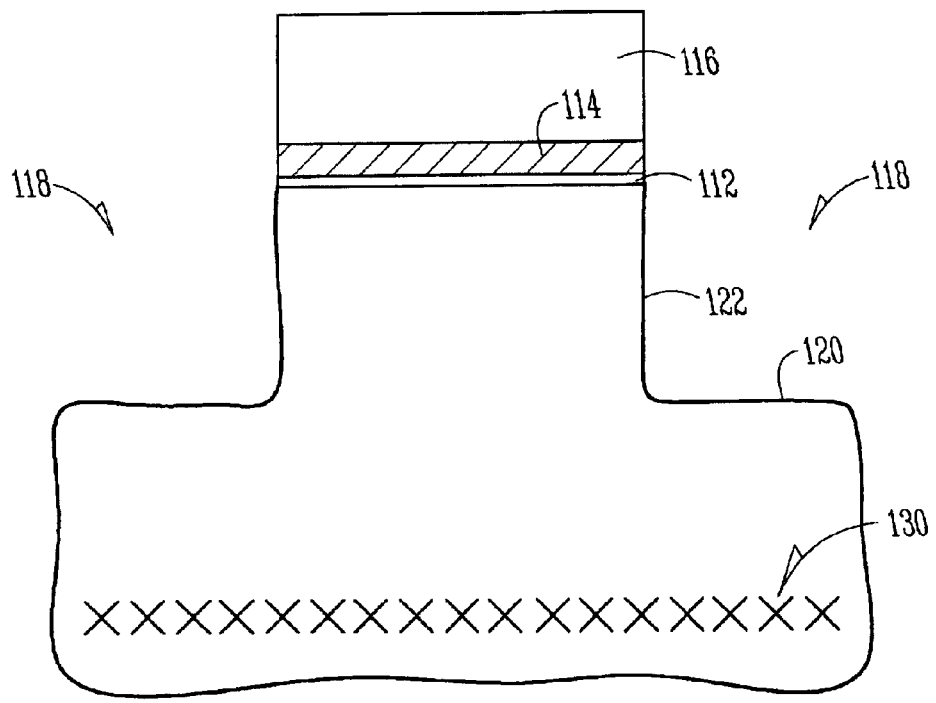
FIG. 13 is a cross section of the structure depicted in FIG. 12 after an anisotropic etch.

FIG. 13 illustrates an embodiment after an etch process that has exposed the regions unprotected by the mask 116. In the etch process, the protective layer 114 and the pad oxide layer 112 have also been patterned, and a recess 118 has been formed with a recess first bottom 120 and a recess first wall 122.

Figure 14:
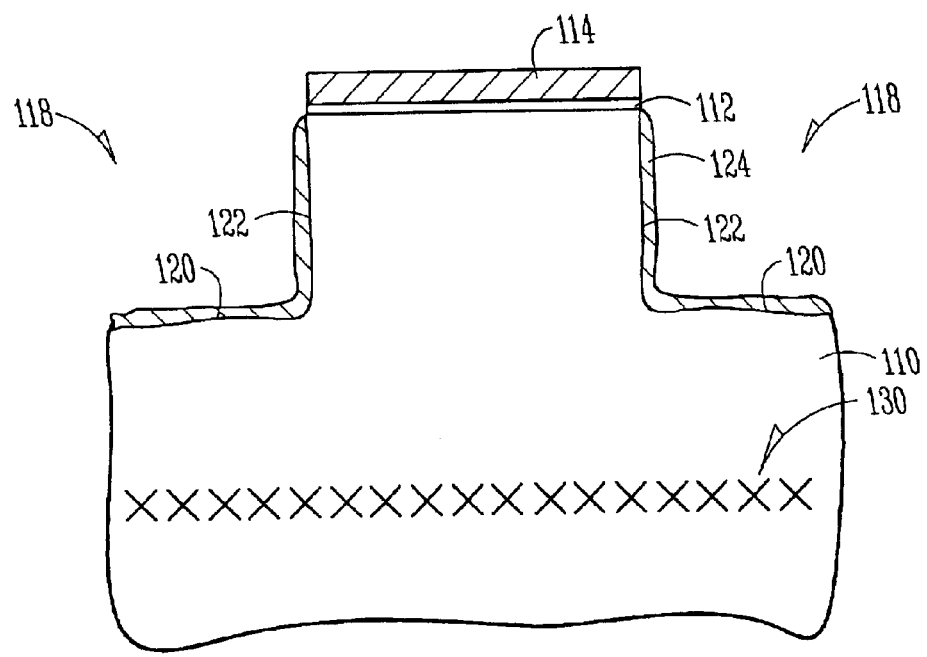
FIG. 14 is a cross section of the structure depicted in FIG. 13 after further processing in which a nitride film has been grown on exposed silicon.

FIG. 14 illustrates the structure depicted in FIG. 13 after further processing in which the mask 116 has been removed and a nitride film 124 has been grown onto the exposed semiconductive material of the substrate 110. In one embodiment, the exposed semiconductive material of the substrate 110 is exposed silicon. The nitride film 124 is depicted as covering the recess first bottom 120 and the recess first wall 122. The nitride film 124 may be grown by known process under conditions that deposit only upon semiconductive material such as exposed silicon as set forth herein for the embodiments depicted in FIG. 3 such as RPN, RTN, RPO, and RTO.

Figure 15:
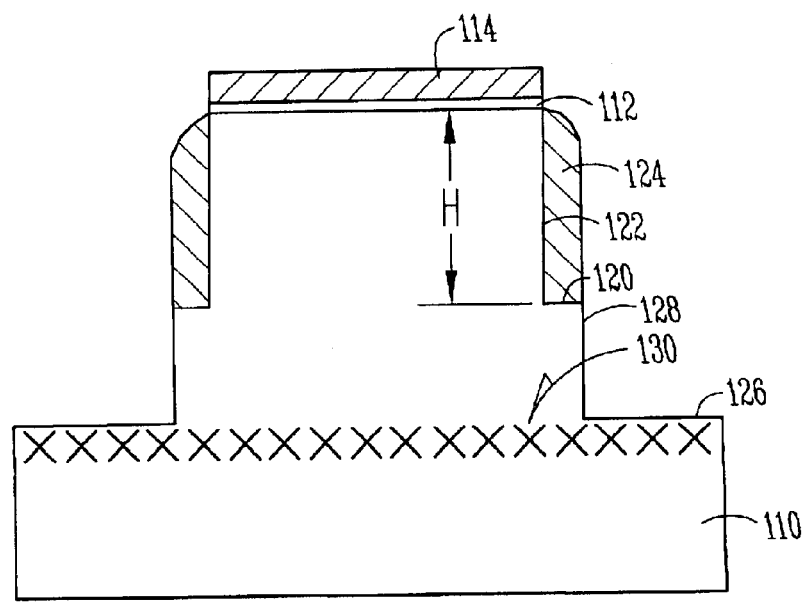
FIG. 15 is a cross section of the structure depicted in FIG. 14 after further processing.

FIG. 15 illustrates processing of the substrate 110 in which an etch has formed a recess second wall 128 and a recess second bottom 126 below the level of the recess first bottom 120. Because of the presence of the nitride film 124, the recess first wall 112 is protected, and the recess second wall 128 has been formed that is approximately coplanar with the lateral extremity of the nitride film 124. In one embodiment, an anisotropic etch, such as a reactive ion etch, is used such that the nitride film 124 is left standing upon what is left of the recess first bottom 120. For a 0.25-micron CD process, the remnant of the nitride film 124 has a height, H, in a range from about 0.1 micron to about 0.15 microns. In this dimension, the distance from the remnant of the recess first bottom 120 to the recess second bottom 126 is in a range from about 0.1 micron to about 0.3 microns.

At the level of the recess second bottom 126, the deep implantation region 130 is exposed. According to an embodiment, the deep implantation region 130 acts as an etch stop. In one example, an anisotropic etch is carried out that has an etch recipe selective to the deep implantation region 130.

In another embodiment, external process control is used to stop the etch at the level of the deep implantation region 130. After the etch that either stops on the deep implantation region 130 by chemical selectivity, or by external process control, an isotropic etch recipe is used in subsequent processing that is selective to the amorphous material of the deep implantation region 130, but the etch recipe removes bulk semiconductive material in the substrate 110. In one embodiment, the etch recipe is a wet TMAH etch as set forth herein for other embodiments. In another embodiment, the wet etch uses a KOH etch chemistry as set forth herein for other embodiments. The isotropic etch may also be combined with an anisotropic etch, either before or after the isotropic etch. By using both an isotropic and an anisotropic etch, both the downward etching and the undercutting of the nitride film 124 may be varied to suit particular applications.

Figure 16:
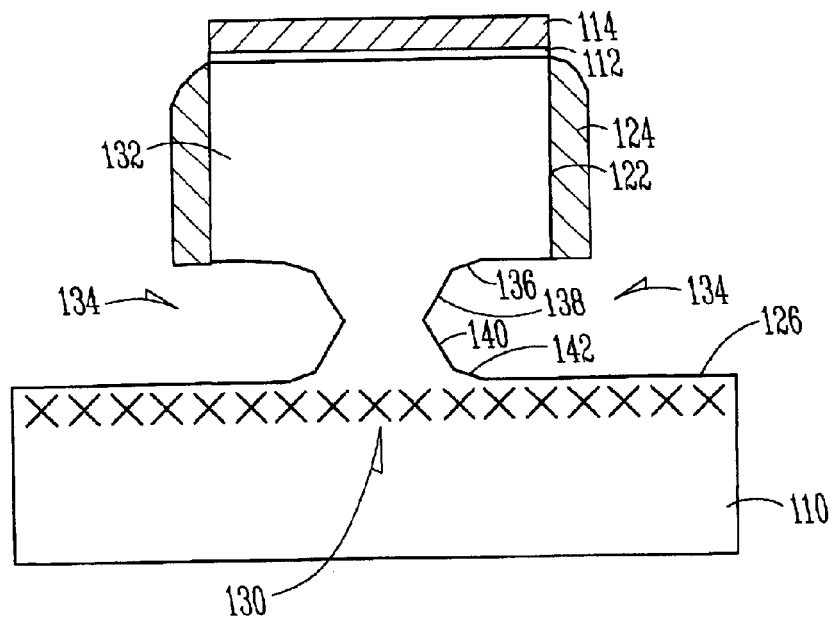
FIG. 16 is a cross section of the structure depicted in FIG. 15 after further processing in which a lateral recess has been etched.

Various wet TMAH etch recipes are known that are selective to amorphous silicon and to nitride films, and that isotropically etch bulk monocrystalline silicon along crystallographic planes. FIG. 16 illustrates the results of a TMAH etch that has formed a lateral cavity 134 that has undercut the active area 132. By this undercutting etch, the active area 132 has been mostly separated from the bulk semiconductive material in the substrate 110 and substantially no etching through the deep implantation region 130 has occurred.

Under the etch conditions, and due to the scale of the lateral cavity 134, a distinctive contour may appear therein. The TMAH etch has an effect along crystallographic planes such that a faceted contour may appear within the lateral cavity 134. It can be seen that faceted surfaces 136, 138, 140, and 142 are illustrated. However, these are depicted in arbitrary shape, angle and size for illustrative purposes, and the specific shapes, angles, and sizes of the faceted surfaces will depend upon the crystallographic orientation of the bulk semiconductive material in the substrate 110 and the specific etch conditions. According to the specific etch conditions, a photomicrographic view of the lateral cavity 134 will depict substended crystallographic planes of bulk semiconductive material in the substrate 110 that have been exposed by the TMAH etch.

Figure 17:
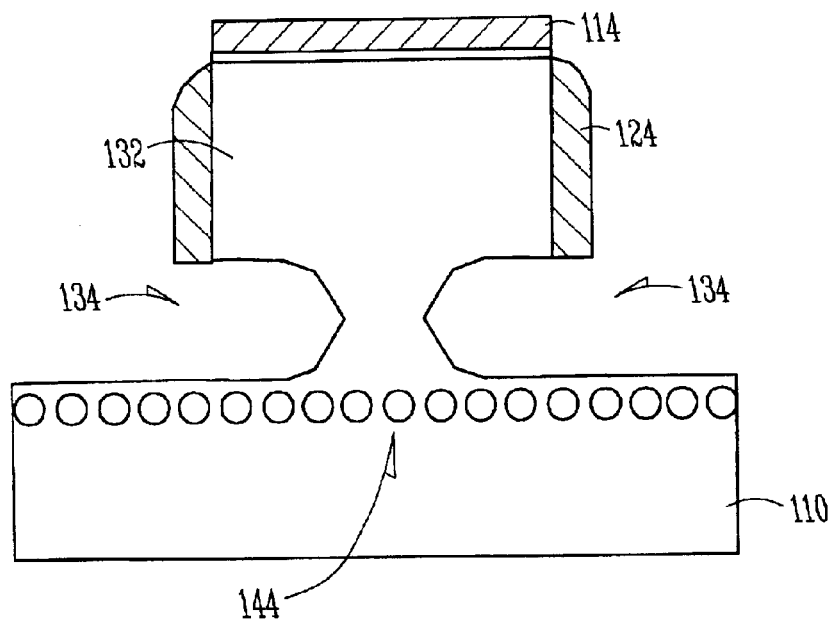
FIG. 17 is a cross section of the structure depicted in FIG. 16 after an anneal process.

After formation of the lateral cavity 134, the deep implantation region 130 is treated to form an annealed deep implantation region 144 as illustrated in FIG. 17. Particularly at free surfaces, the annealed deep implantation region 144 has been return to substantially the same semiconductive quality as the bulk semiconductive material in the substrate 110 by repairing at least some of the monocrystalline lattice in what was the deep implantation region 130 (FIG. 16). Further processing, including oxidation, oxide spacer formation, STI oxide fill processing, planarization, and device construction, among other processes are carried out as set forth in embodiments in this disclosure.

Figure 18:
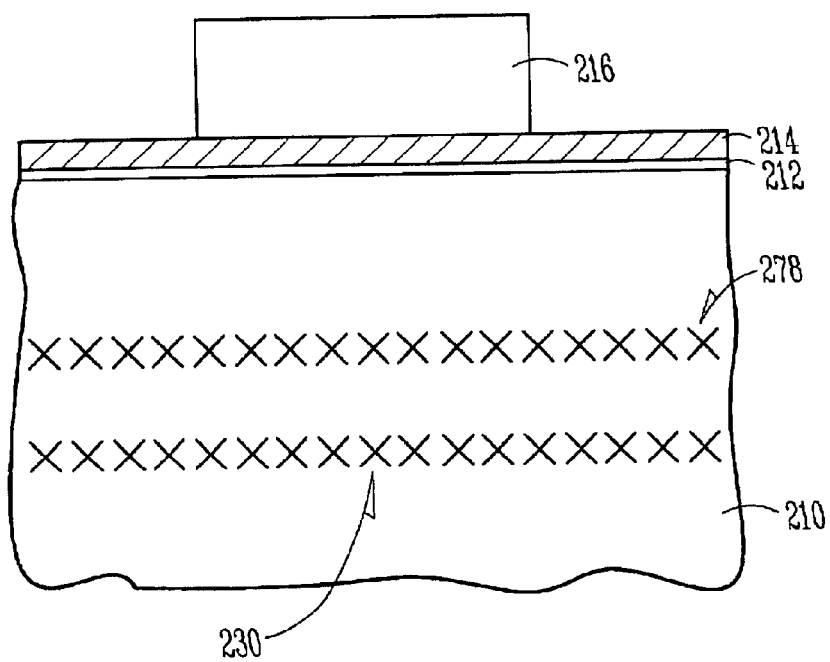
FIG. 18 is a cross section of a structure during processing according to an embodiment.

FIG. 18 illustrates another embodiment in which two implantation regions are first implanted into the substrate. In one embodiment, the substrate 210 has a deep implantation region 230 that has been first blanket implanted to a qualitative depth that is equivalent to the location of the deep implantation region 30 depicted in FIG. 4, or the deep implantation region 130 depicted in FIG. 14. A shallow implantation region 278 is second blanket implanted into the substrate 210. The shallow implantation region 278 is implanted to a qualitative depth that is equivalent to the location of the recess first bottom 20 depicted in FIG. 4, or the recess first bottom 120 depicted in FIG. 14. As in other embodiments set forth herein, the deep implantation region 230 and the shallow implantation region 278 are implanted with materials that are substantially identical to the bulk semiconductive material in the substrate 210. Implantation is carried out at an energy level that achieves self-interstitial implantation, and that causes the implantation regions 230 and 278 to become amorphous enough to have an etch responsiveness that is different from the bulk semiconductive material in the substrate 210. The achievement of the implantation regions 230 and 278 is done according to processing conditions known in the art, and as set forth herein. The implantation profiles are controlled to be narrow with respect to the specific process geometry. In one embodiment, the implantation profiles each have a height of about 0.05 microns.

A pad oxide layer 212 is also deposited on the substrate 210, as well as a protective layer 214 on top of the pad oxide layer 212 to act as a buffer during subsequent etch steps and other processing. In one embodiment, the protective layer 214 is polysilicon. In one embodiment, the protective layer 214 is a nitride material. In another embodiment, the protective layer 214 is a polysilicon layer that is covered with a nitride material. The specific combination is selected depending upon process integration choices.

A mask 216 is formed and patterned upon the protective layer 214. As set forth herein for other embodiments, the mask 216 is either a photoresist material or a hard-mask material such as a nitride or oxide. The area protected by the mask 116 defines what will become a partially isolated active area in a partial SOI structure.

Figure 19:
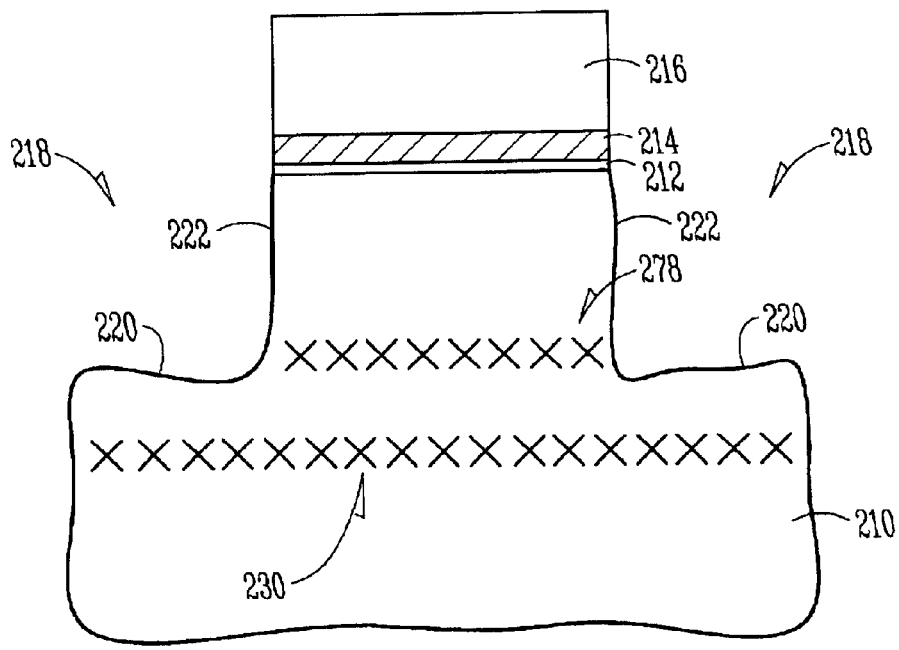
FIG. 19 is a cross section of the structure depicted in FIG. 18 after an anisotropic etch.

FIG. 19 illustrates an embodiment after an etch process that has exposed the regions unprotected by the mask 216. In the etch process, the protective layer 214 and the pad oxide layer 212 have also been patterned, and a recess 218 has been formed with a recess first bottom 220 and a recess first wall 222. It is noted that the first etch has also stopped at or below the level of the shallow implantation region 278.

Figure 20:
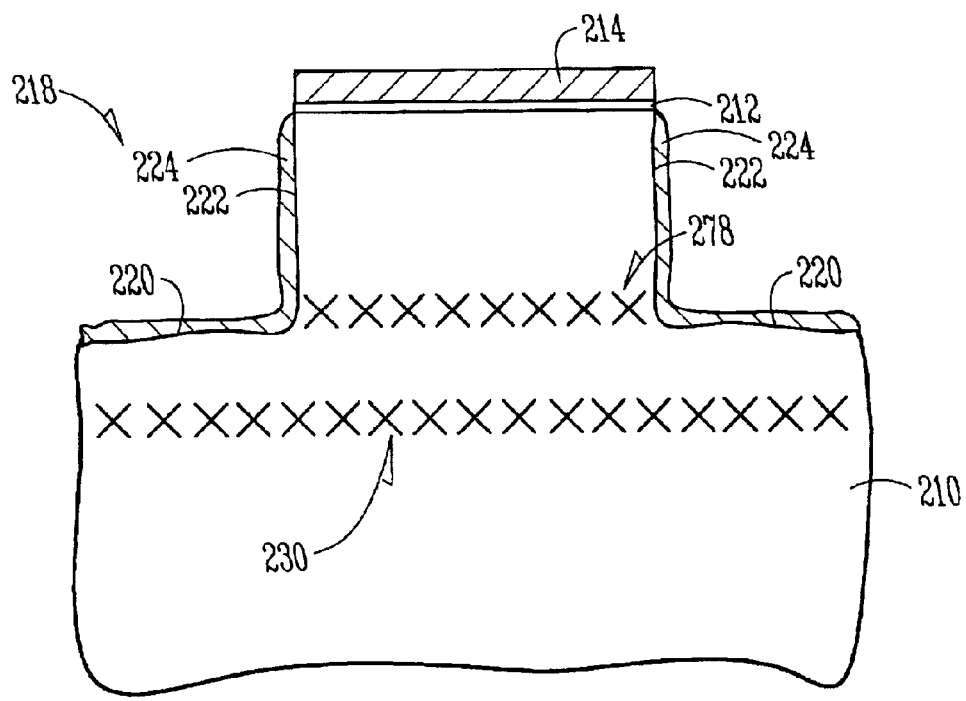
FIG. 20 is a cross section of the structure depicted in FIG. 19 after further processing in which a nitride film has been grown on exposed silicon.

FIG. 20 illustrates the structure depicted in FIG. 19 after further processing in which the mask 216 has been removed and a nitride film 224 has been grown onto the exposed semiconductive material of the substrate 210. In one embodiment, the exposed semiconductive material of the substrate 210 is exposed silicon. The nitride film 224 is depicted as covering the recess first bottom 220 and the recess first wall 222. The nitride film 224 may be grown by known process under conditions that deposit only upon semiconductive material such as exposed silicon as set forth herein for the embodiments depicted in FIG. 3 and FIG. 14. The nitride film 224 may be grown by known process under conditions that deposit only upon semiconductive material such as exposed silicon as set forth herein for the embodiments depicted in FIG. 3 such as RPN, RTN, RPO, and RTO.

Figure 21:
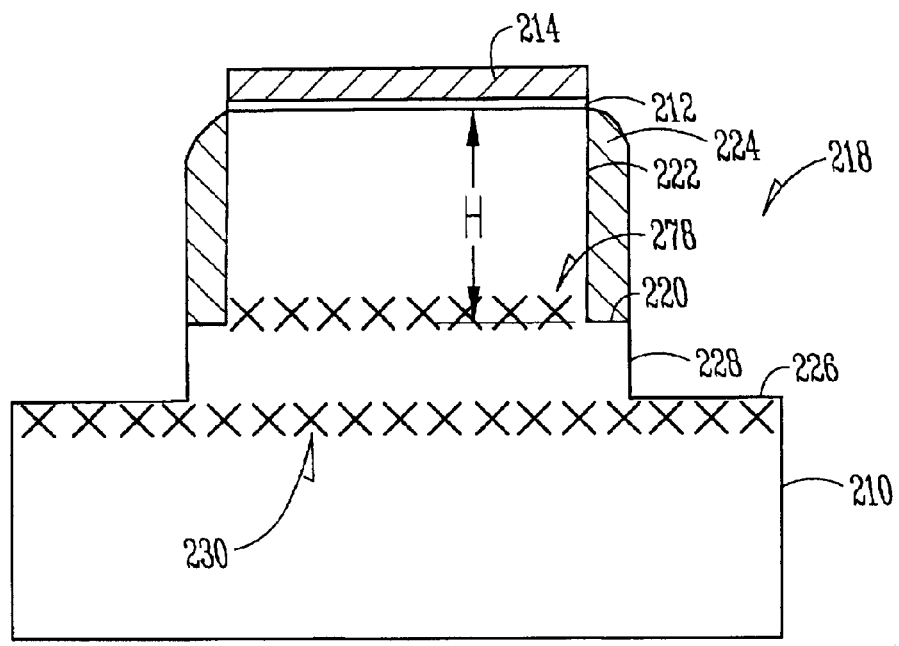
FIG. 21 is a cross section of the structure depicted in FIG. 20 after further processing.

FIG. 21 illustrates processing of the substrate 210 in which an etch has formed a recess second wall 228 and a recess second bottom 226 below the level of the recess first bottom 220. Because of the presence of the nitride film 224, the recess first wall 222 is protected, and the recess second wall 228 has been formed that is approximately coplanar with the lateral extremity of the nitride film 224. In one embodiment, an anisotropic etch, such as a reactive ion etch, is used such that the nitride film 224 is left standing upon what is left of the recess first bottom 220. For a 0.25-micron CD process, the remnant of the nitride film 224 has a height, H, in a range from about 0.1 microns to about 0.15 microns. In this dimension, the distance from the remnant of the recess first bottom 220 to the recess second bottom 226 is in a range from about 0.1 microns to about 0.3 microns. According to an embodiment, the deep implantation region 230 acts as an etch stop. In one example, an anisotropic etch is carried out that has an etch recipe selective to the deep implantation region 230.

Figure 22:
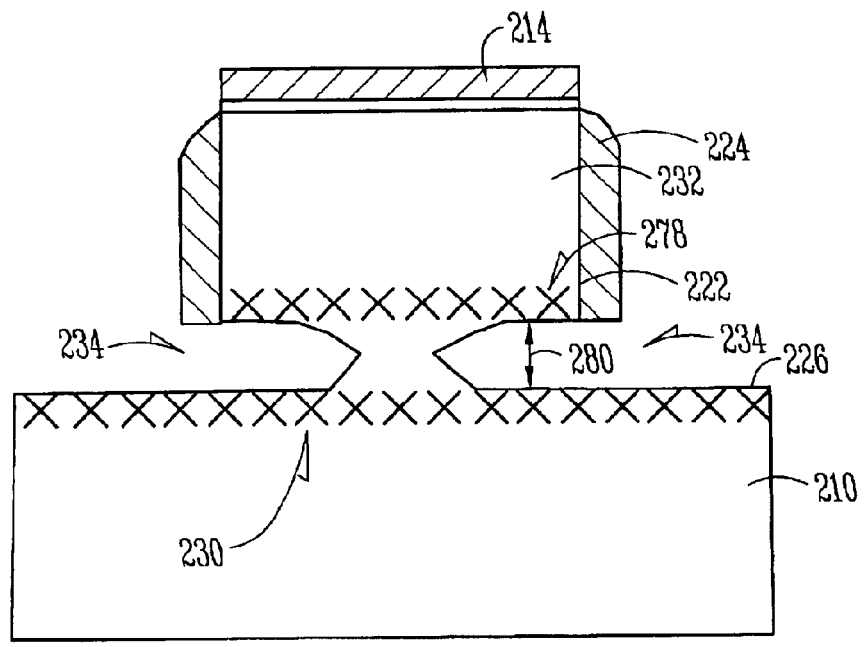
FIG. 22 is a cross section of the structure depicted in FIG. 21 after further processing in which a lateral recess has been etched.

FIG. 22 illustrates further processing according to an embodiment. After the etch that either stops on the deep implantation region 230 by chemical selectivity, or by external control, an isotropic etch recipe is used in subsequent processing that is selective to the amorphous material of the shallow implantation region 278 and the deep implantation region 230. The etch recipe removes bulk semiconductive material in the substrate 110 that lies between the shallow implantation region 278 and the deep implantation region 230. In this embodiment, the formation of a lateral cavity 234 is restricted by the presence of the shallow implantation region 278 above, and the deep implantation region 230 below. Accordingly, the height 280 of the lateral cavity 234 is controllable, subject to process restrictions such as the depths of the respective the shallow- and deep implantation regions 278 and 230 and their spacing apart one from the other. In one embodiment, the height 280 is in a range from about 0.01 microns to about 0.1 microns. In another embodiment, the height 280 is about 0.02 microns. This embodiment is useful wherein a voided lateral cavity 234 will have a dielectric constant essentially that of air because any oxidation or subsequent fill of the recess 218 may not penetrate into the lateral cavity 234.

In one embodiment, the etch recipe for forming the lateral cavity 234 is a wet TMAH etch as set forth herein for other embodiments. In another embodiment, the wet etch uses a KOH etch chemistry as set forth herein for other embodiments. The isotropic etch may also be combined with an anisotropic etch, either before or after the isotropic etch.

FIG. 22 illustrates the results of a TMAH etch that has formed the lateral cavity 234 that has undercut the active area 232. By this undercutting etch, the active area 232 has been mostly separated from the bulk semiconductive material in the substrate 210.

Under the etch conditions, and due to the scale of the lateral cavity 234, a distinctive contour may appear therein. The TMAH etch has an effect along crystallographic planes such that a faceted contour may appear within the lateral cavity 234 as discussed for embodiments depicted in FIGS. 5 and 16. As set forth for other embodiments, the specific shapes, angles, and sizes of the faceted surfaces will depend upon the crystallographic orientation of the bulk semiconductive material in the substrate 210. According to the specific etch conditions, a photomicrographic view of the lateral cavity 234 will depict substended crystallographic planes of bulk semiconductive material in the substrate 210 that have been exposed by the TMAH etch.

Figure 23:
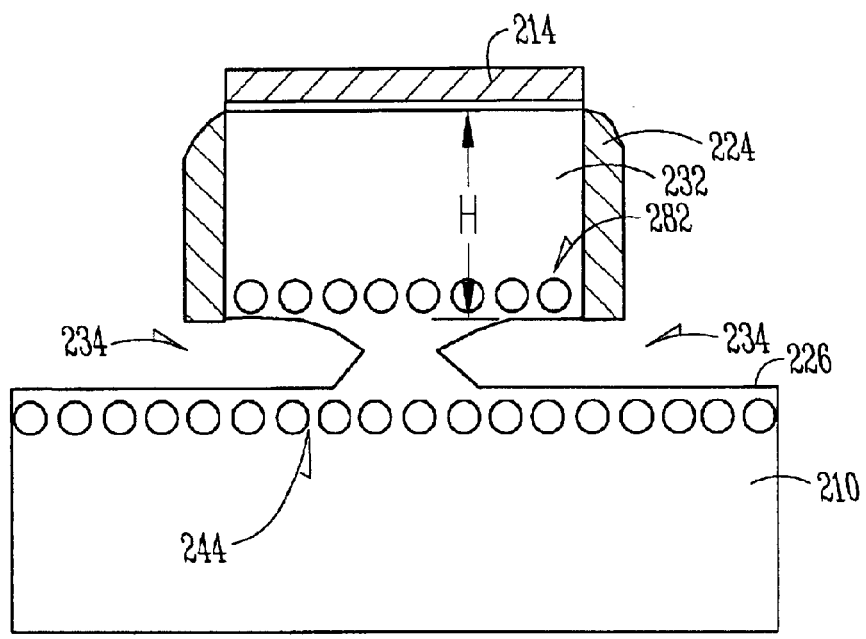
FIG. 23 is a cross section of the structure depicted in FIG. 22 after an anneal process.

After formation of the lateral cavity 234, the implantation regions 278 and 230 are treated by a process such as solid-phase epitaxy to form annealed implantation regions 282 and 224, respectively, as illustrated in FIG. 23. Particularly at the free surfaces, the annealed implantation regions 282 and 224 have been returned to substantially the same semiconductive quality as the bulk semiconductive material in the substrate 110 by repairing the monocrystalline lattice in what was the implantation region 278 and 230 (FIG. 22). In one embodiment, although some portions of the implantation regions 278 and 230 (FIG. 22) may not totally return to substantially the same semiconductive quality as the bulk semiconductive material in the substrate 210 and in the active area 232, the depth 224 of the active area 232 (also measured by the height, H, of the nitride film) may be controlled such that the amorphous portions, if any, that remain will be significantly far from the final channel and junctions of the active area 232 such that they are operative. Further processing, including minifield oxidation, oxide spacer formation, STI oxide fill processing, planarization, and device construction, among other processes are carried out as set forth in embodiments in this disclosure. In one embodiment, the minifield oxidation consumes significant remaining implantation regions 282 and 244.

To one of ordinary skill in the art, it now becomes clear that other processing variations are possible. For example (referring to FIGS. 2 and 4 as a guide), the deep implantation region 30 may be first formed after the first etch by implanting through the recess first bottom 20 to what will become the level of the recess second bottom 26. In this example, the deep implantation region 30 may be formed in a reactive ion etch (RIE) chamber that also carries out the second etch, and the conditions can proceed after the first etch and growth of the nitride film 24 by an ion implantation to form the deep implantation region 30 through the first bottom, and a second etch that stops on the deep implantation region 30.

The processes and structures that are achieve in the various embodiments are inventively applicable to a variety of devices and apparatuses. Preferred systems may be made by process embodiments, or that include an embodiment or embodiments of the structure. For example, a chip package may contain a partially isolated structure such as an active area set forth in this disclosure. In one embodiment, an array of active areas is included such as a line of sense amplifiers that use the active areas, or a 2-dimensional array of storage devices such as a DRAM array. In another embodiment, the partially isolated structure is part of an electrical device that includes the semiconductor substrate in a chip package and the chip package is part of a memory module or part of a chipset. In another embodiment, the memory module is part of a dynamic random access memory module that is inserted into a host such as a motherboard or a digital computer. In another embodiment, preferred systems may be made that include the partially isolated structure. For example, a chip package may contain a substrate such as one set forth in this disclosure. In another embodiment, the partially isolated structure is part of an electrical device that includes the semiconductor substrate in a chip package and the chip package is part of a memory module or part of a chipset. In another embodiment, the memory module is part of a dynamic random access memory module that is inserted into a host such as a motherboard or a digital computer. In another embodiment, the partially isolated structure is part of an electronic system. In another embodiment, the partially isolated structure is fabricated with a floating gate. In another embodiment, the partially isolated structure is fabricated with a floating gate that is part of a flash memory device that in turn is part of a chipset such as a basic input-output system (BIOS) for an electrical device.

Figure 24:
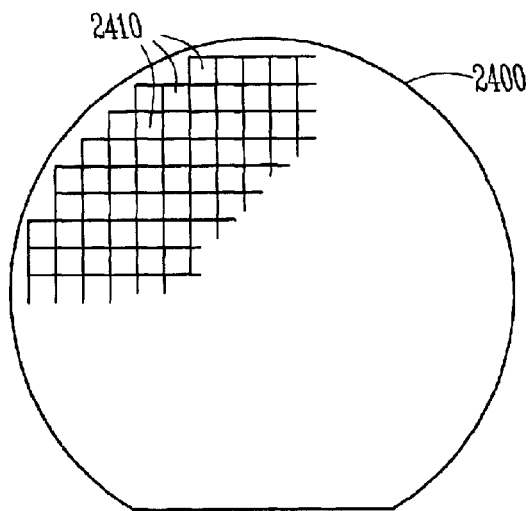
FIG. 24 is a top view of a wafer or substrate containing semiconductor dies in accordance with an embodiment.

In another embodiment, preferred systems may be made that include the partially isolated structure. With reference to FIG. 24, a semiconductor die 2410 may be produced from a silicon wafer 2400 that may contain the partially isolated active area structures 32, 132, and 232 respectively, such as are depicted in FIGS. 7, 8, and 9. A die 2410 is an individual pattern, typically rectangular, on a substrate such as substrate 10, substrate 110, and substrate 210, that contains circuitry to perform a specific function. A semiconductor wafer 2400 will typically contain a repeated pattern of such dies 2410 containing the same functionality. Die 2410 may further contain additional circuitry to extend to such complex devices as a monolithic processor with multiple functionality. Die 2410 is typically packaged in a protective casing (not shown) with leads extending therefrom (not shown) providing access to the circuitry of the die 2410 for unilateral or bilateral communication and control. In one embodiment, die 2410 is incased in a host such as a chip package (not shown) such as a chip-scale package (CSP).

Figure 25:
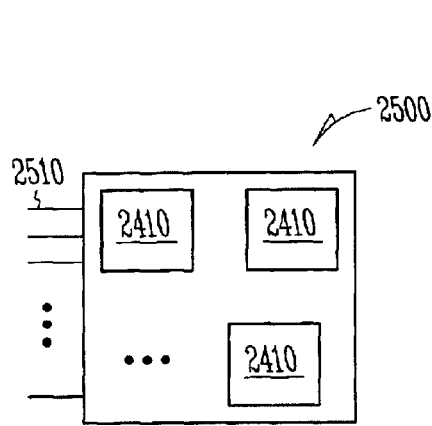
FIG. 25 is a block diagram of a circuit module in accordance with an embodiment.

As shown in FIG. 25, two or more dies 2410 at least one of which contains at least one partially isolated structure such as is depicted in FIGS. 7, 8, and 9, in accordance with various embodiments may be combined, with or without protective casing, into a host such as a circuit module 2500 to enhance or extend the functionality of an individual die 2410. Circuit module 2500 may be a combination of dies 2410 representing a variety of functions, or a combination of dies 2410 containing the same functionality. Some examples of a circuit module 2500 include memory modules, device drivers, power modules, communication modems, processor modules and application-specific modules and may include multi-layer, multi-chip modules. Circuit module 2500 may be a sub-component of a variety of electronic systems, such as a clock, a television, a cell phone, a personal computer, an automobile, an industrial control system, an aircraft, a hand-held, and others. Circuit module 2500 will have a variety of leads 2510 extending therefrom providing unilateral or bilateral communication and control. In another embodiment, circuit module 2500 has a storage device such as is depicted in FIG. 11.

Figure 26:
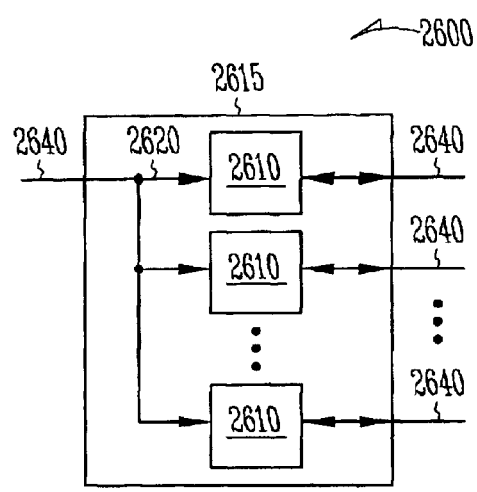
FIG. 26 is a block diagram of a memory module in accordance with an embodiment.

FIG. 26 shows one embodiment of a circuit module as memory module 2600 containing a structure for the inventive partially isolated structure such as are depicted in FIGS. 7, 8, and 9, or the storage device as is depicted in FIG. 11. Memory module 2600 is a host for that generally depicts a Single In-line Memory Module (SIMM) or Dual In-line Memory Module (DIMM). A SIMM or DIMM may generally be a printed circuit board (PCB) or other support containing a series of memory devices. While a SIMM will have a single in-line set of contacts or leads, a DIMM will have a set of leads on each side of the support with each set representing separate I/O signals. Memory module 2600 contains multiple memory devices 2610 contained on support 2615, the number depending upon the desired bus width and the desire for parity. Memory module 2600 may contain memory devices 2610 on both sides of support 2615. Memory module 2600 accepts a command signal from an external controller (not shown) on a command link 2620 and provides for data input and data output on data links 2630. The command link 2620 and data links 2630 are connected to leads 2640 extending from the support 2615. Leads 2640 are shown for conceptual purposes and are not limited to the positions shown in FIG. 26.

Figure 27:
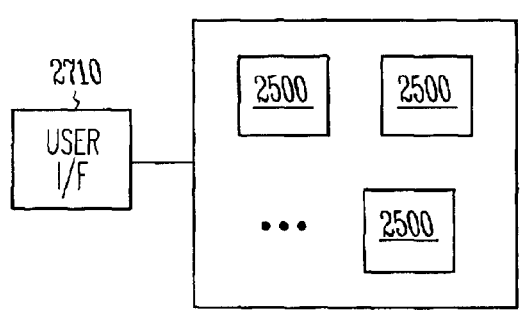
FIG. 27 is a block diagram of an electronic system in accordance with another embodiment the present invention.

FIG. 27 shows another host type such as an electronic system 2700 containing one or more circuit modules 2500 as described above containing at least one of the inventive partially isolated structures or data storage devices. Electronic system 2700 generally contains a user interface 2710. User interface 2710 provides a user of the electronic system 2700 with some form of control or observation of the results of the electronic system 2700. Some examples of user interface 2710 include the keyboard, pointing device, monitor and printer of a personal computer; the tuning dial, display and speakers of a radio; the ignition switch of gas pedal of an automobile; and the card reader, keypad, display and currency dispenser of an automated teller machine. User interface 2710 may further describe access ports provided to electronic system 2700. Access ports are used to connect an electronic system to the more tangible user interface components previously exemplified. One or more of the circuit modules 2500 may be a processor providing some form of manipulation, control or direction of inputs from or outputs to user interface 2710, or of other information either preprogrammed into, or otherwise provided to, electronic system 2700. As will be apparent from the lists of examples previously given, electronic system 2700 will often contain certain mechanical components (not shown) in addition to the circuit modules 2500 and user interface 2710. It will be appreciated that the one or more circuit modules 2500 in electronic system 2700 can be replaced by a single integrated circuit. Furthermore, electronic system 2700 may be a sub-component of a larger electronic system.

Figure 28:
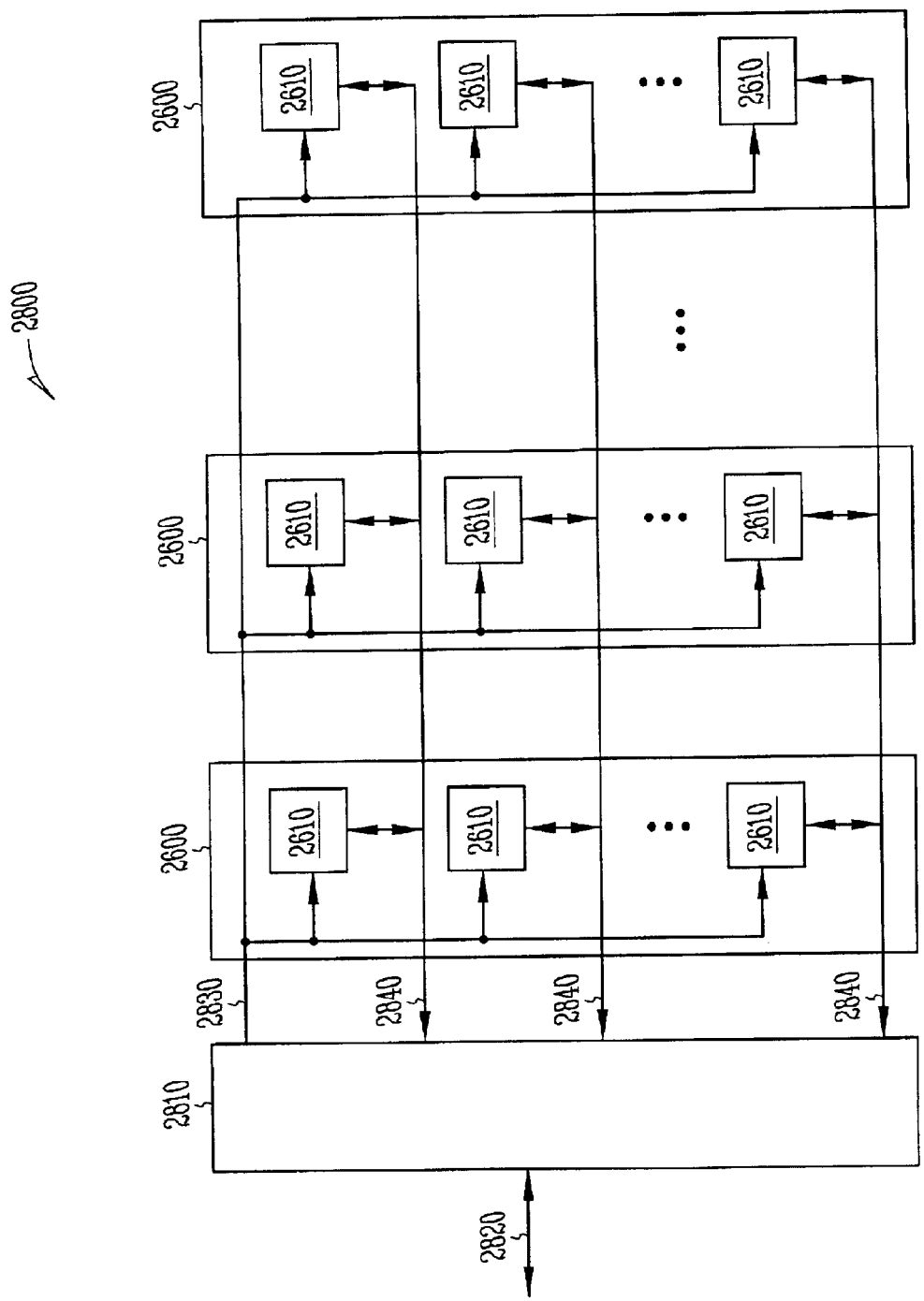
FIG. 28 is a block diagram of a memory system in accordance with an embodiment.

FIG. 28 shows one embodiment of an electrical device at a system level. The electronic system depicted in FIG. 28 is a memory system 2800. Memory system 2800 acts as a higher-level host that contains one or more memory modules 2600 as described above including at least one of the partially isolated structure or the data storage device such as set forth herein in accordance with the present invention and a memory controller 2810 that may also include circuitry for the inventive partially isolated structure or the data storage device. Memory controller 2810 provides and controls a bidirectional interface between memory system 2800 and an external system bus 2820. Memory system 2800 accepts a command signal from the external system bus 2820 and relays it to the one or more memory modules 2600 on a command link 2830. Memory system 2800 provides for data input and data output between the one or more memory modules 2600 and external system bus 2820 on data links 2840.

Figure 29:
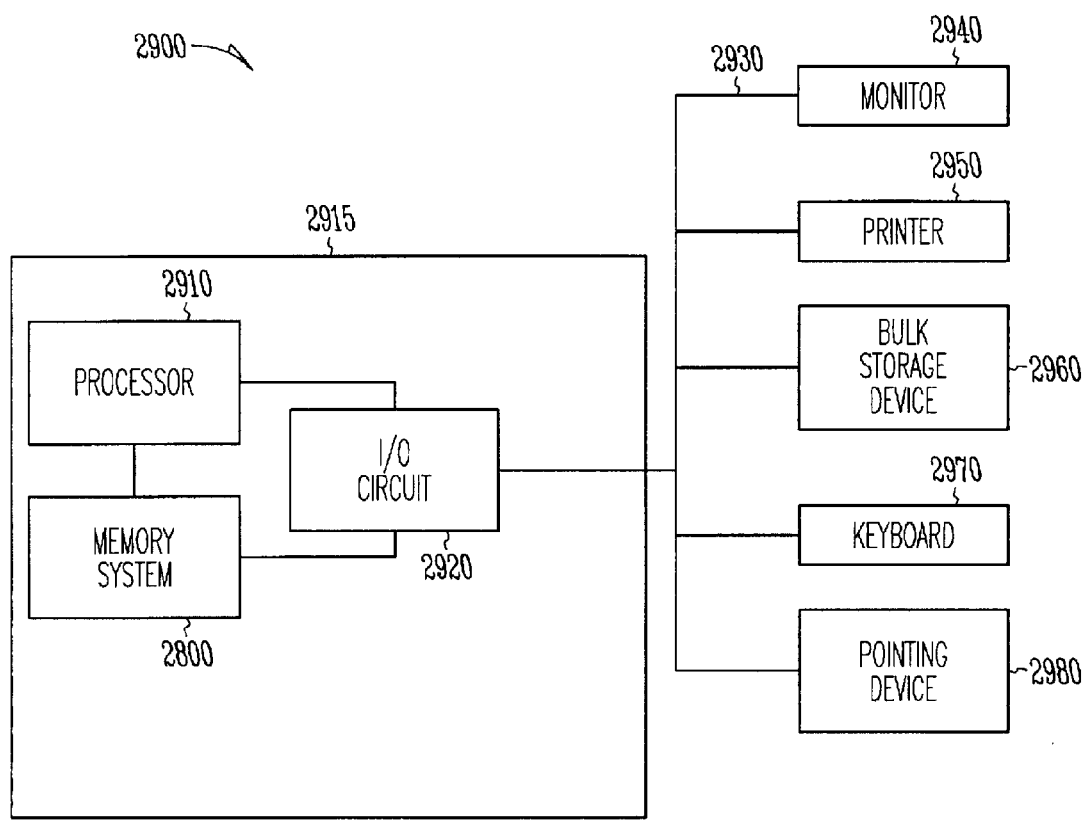
FIG. 29 is a block diagram of a computer system in accordance with an embodiment.

FIG. 29 shows a further embodiment of an electronic system as a computer system 2900. Computer system 2900 contains a processor 2910 and a memory system 2800 housed in a computer unit 2915. Computer system 2900 is but one example of an electronic system containing another electronic system, i.e. memory system 2600, as a subcomponent. The computer system 2900 may contain an input/output (I/O) circuit 2920 that is coupled to the processor 2910 and the memory system 2600. Computer system 2900 optionally contains user interface components that are coupled to the I/O circuit 2920. In accordance with the present invention a plurality partially isolated structures or data storage devices may each be coupled to one of a plurality of I/O pads or pins 2930 of the I/O circuit 2920. The I/O circuit 2920 may then be coupled a monitor 2940, a printer 2950, a bulk storage device 2960, a keyboard 2970 and a pointing device 2980. It will be appreciated that other components are often associated with computer system 9400 such as modems, device driver cards, additional storage devices, etc. It will further be appreciated that the processor 2910, memory system 2600, I/O circuit 2920 and partially isolated structures or data storage devices of computer system 2900 can be incorporated on a single integrated circuit. Such single package processing units reduce the communication time between the processor 2910 and the memory system 2900.

CONCLUSION

Thus has been shown a partially isolated active area and a process of fabricating the partially isolated active area that uses at least a deep implantation region to facilitate an etch that forms a lateral cavity. Embodiments of the present invention relate to processes that facilitate the partial isolation of the active area and varying degrees of oxidation if present in the lateral cavity. The partial isolation is carried out by an etch that is selective to an deep implantation region. The deep implantation region has been temporarily made amorphous, and a silicon ledge forms above the amorphous material. The process solves the problem of achieving an etch differential quality at the bottom of a trench that was carried out by other methods such as an extra deposition. The process also results in various degrees of partial isolation, depending upon the extent of a minifield oxidation operation, if it is present. Where there is a native oxide film in the lateral recess, a faceted surface remains as a result of the specific etch conditions.

A structure is also achieved that includes a faceted lateral cavity in one embodiment. The faceted lateral cavity acts to partially isolate the active area from the bulk of the substrate.

While the present invention has been described in connection with a preferred embodiment thereof, those of ordinary skill in the art will recognize that many modifications and variations may be employed. For example, the sample dimensions and process parameters disclosed herein may be varied and are disclosed for the purpose of illustration and not limitation. The foregoing disclosure and the following claims are intended to cover all such modifications and variations.

What is claimed is:

1. A process comprising:
   patterning a substrate, wherein the substrate includes a protective layer;
   first etching a recess in the substrate to a recess first bottom;
   growing a dielectric film upon exposed semiconductive material of the substrate;
   second etching in the recess to a recess second bottom;
   from a silicon source, forming a deep implantation region in the recess second bottom; and
   third etching a lateral cavity at the recess second bottom, wherein the third etching is selective to the deep implantation region.

2. The process according to claim 1, further including:
   annealing the substrate under conditions to repair semiconductive material of the deep implantation region.

3. The process according to claim 1, wherein third etching is carried out under conditions to cause faceting of the substrate within the lateral cavity.

4. The process according to claim 1, further including:
   annealing the substrate under conditions to repair semiconductive material of the deep implantation region; and
   forming an oxidation in the lateral cavity, wherein the oxidation has a thickness in a range from a native oxide layer to about 0.1 microns.

5. The process according to claim 1, further including:
   annealing the substrate under conditions to repair semiconductive material of the deep implantation region;
   forming an oxidation in the lateral cavity; and
   covering the lateral cavity with a spacer, wherein the spacer is formed by a blanket oxide deposition and spacer etch.

6. The process according to claim 1, further including:
   annealing the substrate under conditions to repair semiconductive material of the deep implantation region;
   forming an oxidation in the lateral cavity;
   covering the lateral cavity with a spacer;
   filling the recess; and
   planarizing the substrate to expose the protective layer.

7. A process comprising:
   patterning a substrate, wherein the substrate includes a protective layer;
   first etching a recess in the substrate to a recess first bottom;
   growing a dielectric film upon exposed semiconductive material of the substrate;
   second etching in the recess to a recess second bottom;
   forming a deep implantation region in the recess second bottom; and
   third etching a lateral cavity at the recess second bottom, wherein the third etching is selective to the deep implantation region wherein forming a deep implantation region at the level of the recess second bottom is carried out before first etching.

8. A process comprising:
   patterning a substrate, wherein the substrate includes a protective layer;
   first etching a recess in the substrate to a recess first bottom;
   growing a dielectric film upon exposed semiconductive material of the substrate;
   second etching in the recess to a recess second bottom;
   forming a deep implantation region in the recess second bottom;
   third etching a lateral cavity at the recess second bottom, wherein the third etching is selective to the deer implantation region;
   forming a shallow implantation region in the substrate at a level of the recess first bottom; and either preceded or followed by forming the deep implantation region in the substrate at a level of the recess second bottom.

9. A process of forming an active area, comprising:

patterning a substrate, wherein the substrate includes a protective layer;

first etching a recess in the substrate to a recess first bottom;

growing a dielectric film upon exposed semiconductive material of the substrate;

second etching in the recess to a recess second bottom;

from a silicon source, forming a deep implantation region at a level of the recess second bottom; and third etching a lateral cavity at the recess second bottom, wherein the third etching is selective to the deep implantation region, and wherein the third etching partially isolates an active area in the substrate at a level above the recess first bottom.

10. The process of forming an active area according to claim 9, further including:

forming at least one junction in the active area.

11. The process of forming an active area according to claim 9, further including:

forming at least one junction in the active area; and forming a storage device above the at least one junction.

12. A process comprising:

forming a pad oxide layer over a substrate;

forming a protective layer over the pad oxide layer;

first etching a recess in the substrate to a recess first bottom and a recess first wall;

growing a nitride dielectric film upon exposed semiconductive material of the substrate;

second etching in the recess to a recess second bottom and a recess second wall, and that is selective to the nitride dielectric film disposed on the recess first wall, wherein the recess second wall is substantially coplanar to the nitride dielectric film;

forming deep implantation region at a level of the recess second bottom, wherein forming a deep implantation region at a level of the recess second bottom includes implanting material that is substantially identical to the material of the substrate; and third etching a lateral cavity at the recess second bottom, wherein the third etching is an isotropic etch selected from tetramethyl ammonium hydroxide and potassium hydroxide, and wherein the third etching is selective to the deep implantation region and the nitride film.

13. The process according to claim 12, wherein the protective layer is formed by a deposition process selected from a nitride layer deposition, a polysilicon layer deposition, and combinations thereof.

14. The process according to claim 12, wherein growing a nitride dielectric film upon exposed semiconductive material of the substrate is carried out by a process selected from remote plasma nitridation and rapid thermal nitridation.

15. The process according to claim 12, wherein forming a deep implantation region at a level of the recess second bottom includes implanting conditions to cause the substrate in the deep implantation region to become amorphous, and further including:

annealing the substrate under conditions to repair at least a portion of the deep implantation region to a substantially monocrystalline lattice.

16. The process according to claim 12, wherein third etching partially isolates an active area in the substrate that is undercut by the lateral cavity, and wherein the remaining substrate and the active area are connected through a stem in a thickness range from about 0.03 microns to about 0.1 micron.

17. The process according to claim 12, wherein third etching partially isolates an active area in the substrate that is undercut by the lateral cavity, and wherein the remaining substrate and the active area are connected through a stem in a thickness range from about 0.03 microns to about 0.1 micron, and further including:

annealing the substrate under conditions to repair semiconductive material of the deep implantation region; and forming an oxidation in the lateral cavity, wherein the oxidation has a thickness in a range from a native oxide layer to about 0.1 micron.

18. The process according to claim 12, wherein third etching forms an active area in the substrate that is undercut by the lateral cavity, and wherein the remaining substrate and the active area are connected through a stem in a thickness range from about 0.03 microns to about 0.1 micron, and further including, and further including:

annealing the substrate under conditions to repair semiconductive material of the deep implantation region;

forming an oxidation in the lateral cavity, wherein the oxidation has a thickness in a range from about a native oxide film and about 0.1 micron; and covering the lateral cavity with a spacer, wherein the spacer is formed by a blanket oxide deposition and spacer etch.

19. The process according to claim 12, further including:

forming an at least one junction in the substrate at a level above the recess first bottom.

20. A process comprising:

forming a pad oxide layer over a substrate;

forming a protective layer over the pad oxide layer;

first etching a recess in the substrate to a recess first bottom and a recess first wall;

growing a nitride dielectric film upon exposed semiconductive material of the substrate;

second etching in the recess to a recess second bottom and a recess second wall, and that is selective to the nitride dielectric film disposed on the recess first wall, wherein the recess second wall is substantially coplanar to the nitride dielectric film;

forming a deep implantation region at a level of the recess second bottom; and third etching a lateral cavity at the recess second bottom, wherein the third etching is an isotropic etch selected from tetramethyl ammonium hydroxide and potassium hydroxide, and wherein the third etching is selective to the deep implantation region and the nitride film;

annealing the substrate under conditions to repair semiconductive material of the deep implantation region;

forming an oxidation in the lateral cavity;

covering the lateral cavity with a spacer under conditions to leave at least a portion of the lateral cavity void;

filling the recess; and planarizing the substrate to expose the protective layer.

21. A process of forming an active area, comprising:

from a silicon source, forming a deep implantation region in a semiconductive substrate below a top surface of the substrate, wherein the deep implantation region is amorphous; and isotropically etching the substrate at the deep implantation region under conditions that are selective to the deep implantation region, and that form a lateral cavity that partially isolates an active area in the semiconductive substrate between the lateral cavity and the top surface.

22. The process of forming an active area according to claim 21, wherein forming the deep implantation region is preceded by:

first etching a recess in the substrate to a recess first wall;

growing a dielectric film upon exposed semiconductive material of the substrate; and second etching in the recess to a recess second bottom, the deep implantation region, and that leaves a portion of the dielectric film on the recess first wall.

23. A process of forming an active area, comprising:

forming a deep implantation region in a semiconductive substrate below a top surface of the substrate, wherein the deep implantation region is amorphous;

isotropically etching the substrate at the deep implantation region under conditions that are selective to the deep implantation region, and that form a lateral cavity that partially isolates an active area in the semiconductive substrate between the lateral cavity and the top surface; and forming a shallow implantation region in the substrate that is above the deep implantation region.

24. A process of forming an active area, comprising:

forming a deep implantation region in a semiconductive substrate below a top surface of the substrate, wherein the deep implantation region is amorphous;

isotropically etching the substrate at the deep implantation region under conditions that are selective to the deep implantation region, and that form a lateral cavity that partially isolates an active area in the semiconductive substrate between the lateral cavity and the top surface;

forming a shallow implantation region above the deep implantation region;

first etching a recess in the substrate to a recess first bottom and a recess first wall and that removes a portion of the shallow implantation region;

growing a dielectric film upon exposed semiconductive material of the substrate; and second etching in the recess to a recess second bottom, the deep implantation region, and that leaves a portion of the dielectric film on the recess first wall.

25. A process of forming a storage device, comprising:

patterning a substrate, wherein the substrate includes a protective layer;

first etching a recess in the substrate to a recess first bottom;

growing a dielectric film upon exposed semiconductive material of the substrate;

second etching in the recess to a recess second bottom;

from a silicon source, forming a deep implantation region in the recess second bottom;

third etching a lateral cavity at the recess second bottom, wherein the third etching is selective to the deep implantation region, and wherein the third etching partially isolates an active area above the lateral cavity;

optionally oxidizing the lateral cavity;

removing the dielectric film;

forming a spacer that covers the lateral cavity;

filling the recess; and forming a storage device above the active area.

26. The process of forming a storage device according to claim 25, wherein forming a storage device above the active area further including:

forming at least one word line above the active area;

forming at least one bit line contact above the active area; and forming at least one storage cell above the active area.

27. The process of forming a storage device according to claim 25, wherein forming a storage device above the active area further including:

forming two word lines above the active area;

forming a bit line contact between the two word lines above the active area; and forming two capacitors, each of which is connected the bit line contact through two respective junctions in the active area.

28. A method of assembling an electrical device comprising:

from a silicon source, forming a deep implantation region in a semiconductive substrate below a top surface of the substrate, wherein the deep implantation region is amorphous;

isotropically etching the substrate at the deep implantation region under conditions that are selective to the deep implantation region, and that form a lateral cavity that partially isolates an active area in the semiconductive substrate between the lateral cavity and the top surface; and forming at least one junction in the active area.

29. The method according to claim 28, further including:

configuring the active area in an array of similar active areas.

30. The method according to claim 28, further including:

configuring the active area in an array of similar active areas; and forming a data storage device above the active area.

31. The method according to claim 28, further including:

configuring the active area in an array of similar active areas;

forming a data storage device above the active area; and placing the array in a chip package.

32. The method according to claim 28, further including:

configuring the active area in an array of similar active areas;

forming a data storage device above the active area;

placing the array in a chip package; and placing the chip package into a host, wherein the host includes a chip set.

33. The method according to claim 28, further including:

configuring the active area in an array of similar active areas;

forming a data storage device above the active area;

placing the array in a chip package;

placing the chip package into a host, wherein the host includes a chip set; and incorporating the chip set into an electronic system.

* * * * *

UNITED STATES PATENT AND TRADEMARK OFFICE
CERTIFICATE OF CORRECTION

PATENT NO. : 6,784,076 B2
DATED : August 31, 2004
INVENTOR(S) : Gonzalez et al.

It is certified that error appears in the above-identified patent and that said Letters Patent is hereby corrected as shown below:

Column 11,
Line 26, delete "112" and insert -- 122 --, therefor.

Column 14,
Lines 26 and 28, delete "224" and insert -- 244 --, therefor.

Column 18,
Line 48, after "region" insert -- , --.
Line 63, delete "deer" and insert -- deep --, therefor.

Column 19,
Line 40, after "forming" insert -- a --.

Column 22,
Lines 43, 49 and 57, after "28" delete ",".

Signed and Sealed this

Third Day of May, 2005

JON W. DUDAS
*Director of the United States Patent and Trademark Office*